(12) United States Patent
Cheung

(10) Patent No.: US 7,595,668 B2
(45) Date of Patent: Sep. 29, 2009

(54) HIGH SPEED DYNAMIC FREQUENCY DIVIDER

(75) Inventor: Tszshing Cheung, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 182 days.

(21) Appl. No.: 11/680,841

(22) Filed: Mar. 1, 2007

(65) Prior Publication Data

US 2007/0257714 A1 Nov. 8, 2007

(30) Foreign Application Priority Data

Mar. 28, 2006 (JP) ............... 2006-089544

(51) Int. Cl.
*H03B 19/00* (2006.01)
(52) U.S. Cl. .................. 327/117; 327/115
(58) Field of Classification Search ........... None
See application file for complete search history.

(56) References Cited

U.S. PATENT DOCUMENTS

| | | | |
|---|---|---|---|
| 6,009,139 A * | 12/1999 | Austin et al. ............. | 377/47 |
| 6,285,262 B1 * | 9/2001 | Kuriyama ................. | 331/25 |
| 7,061,284 B2 * | 6/2006 | Boerstler et al. ......... | 327/115 |
| 7,180,341 B2 * | 2/2007 | Harada et al. ............. | 327/117 |
| 7,268,597 B2 * | 9/2007 | Miller, Jr. ................. | 327/117 |
| 2005/0212570 A1 * | 9/2005 | Sun et al. .................. | 327/115 |

FOREIGN PATENT DOCUMENTS

| JP | 63067021 A | * | 3/1988 |
|---|---|---|---|
| JP | 63070615 A | * | 3/1988 |
| JP | 01303928 A | * | 12/1989 |
| JP | 4-341011 | | 11/1992 |
| JP | 5-63557 | | 3/1993 |
| JP | 6-152388 | | 5/1994 |
| JP | 09083351 A | * | 3/1997 |
| JP | 2002-43928 | | 2/2002 |

* cited by examiner

*Primary Examiner*—Cassandra Cox
(74) *Attorney, Agent, or Firm*—Staas & Halsey LLP

(57) ABSTRACT

The frequency divider includes the buffer 30, the function selector 31 and the inverter 32. The output of the function selector 31 is input to the buffer 30. The output of the buffer 30 is fed back to the function selector 31 by two paths. One path includes the inverter 32 and the other does not. The function selector 31 selects one of the paths in synchronous with input clock CK. At one timing the output of the buffer 30 is flipped by the inverter 32. At the next timing the output of the buffer 30 is held the same by the function selector 31 selecting the path not including the inverter 32.

12 Claims, 27 Drawing Sheets

PRIOR ART

PRIOR ART

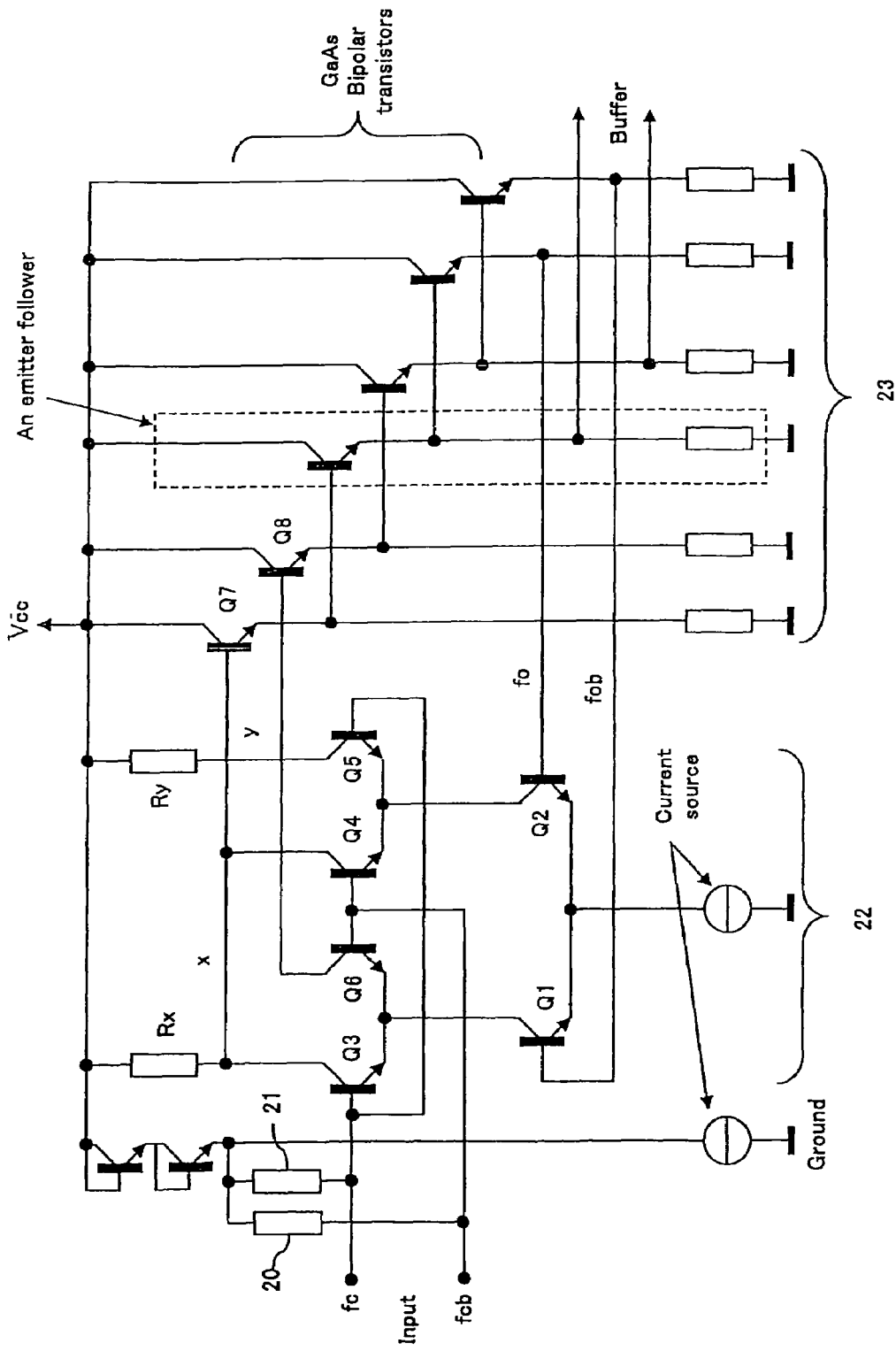
F I G. 4

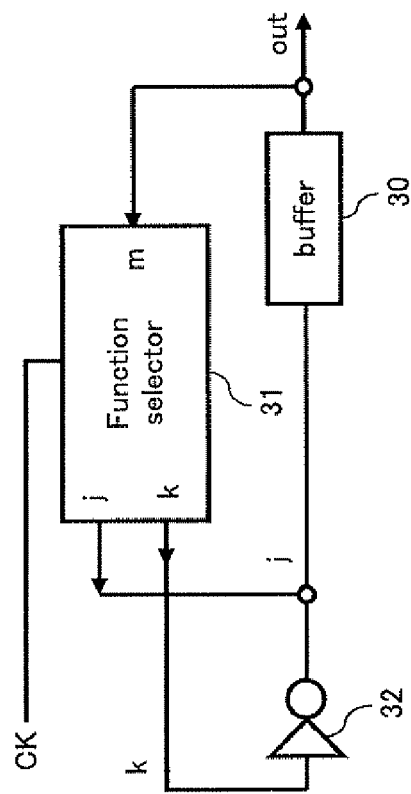
F I G. 5B
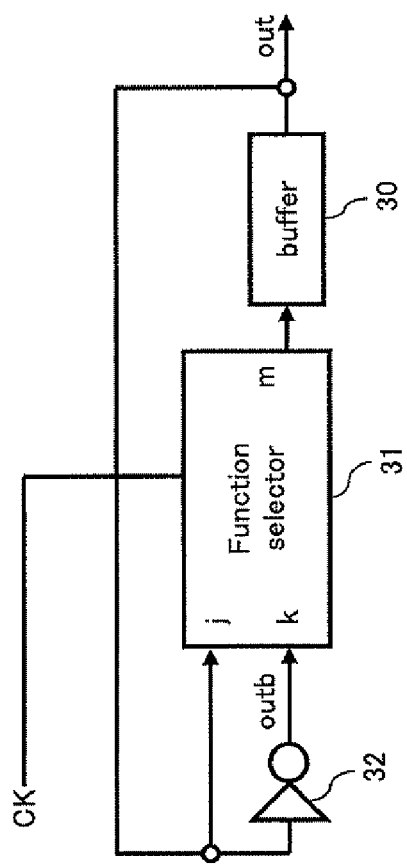
F I G. 5A

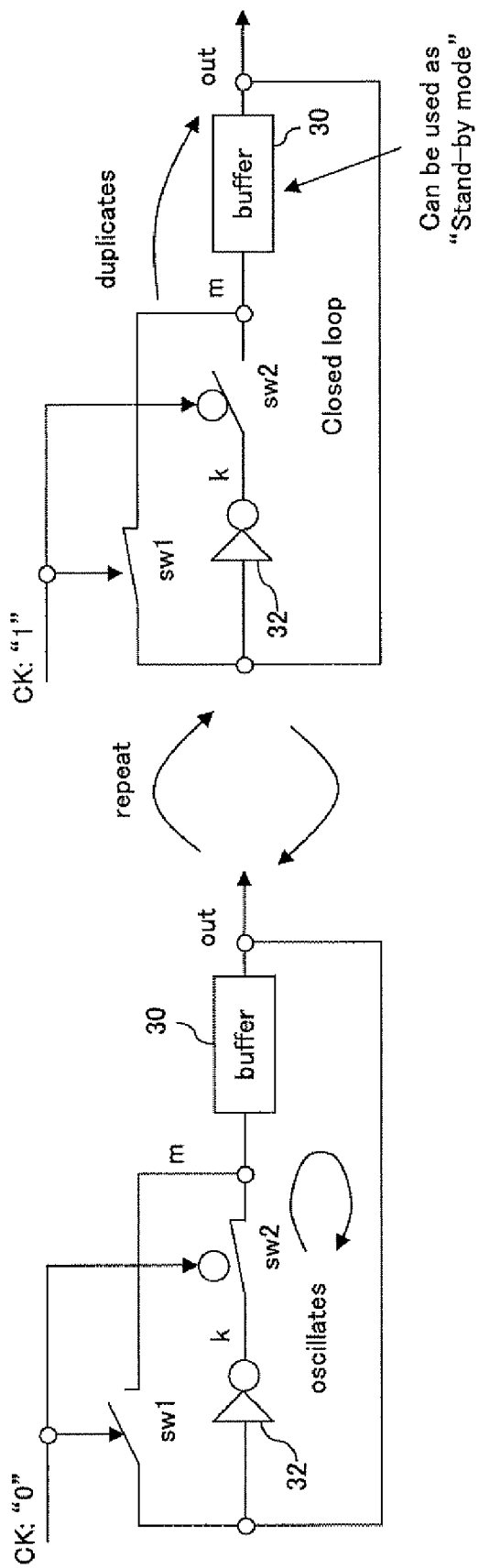
F I G. 7B
F I G. 7A

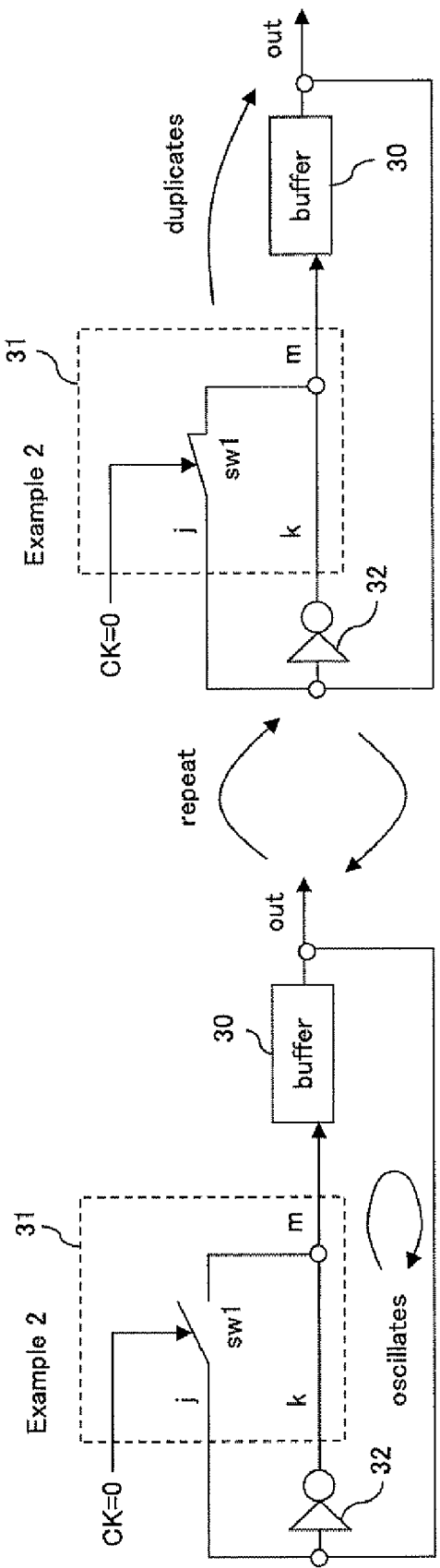

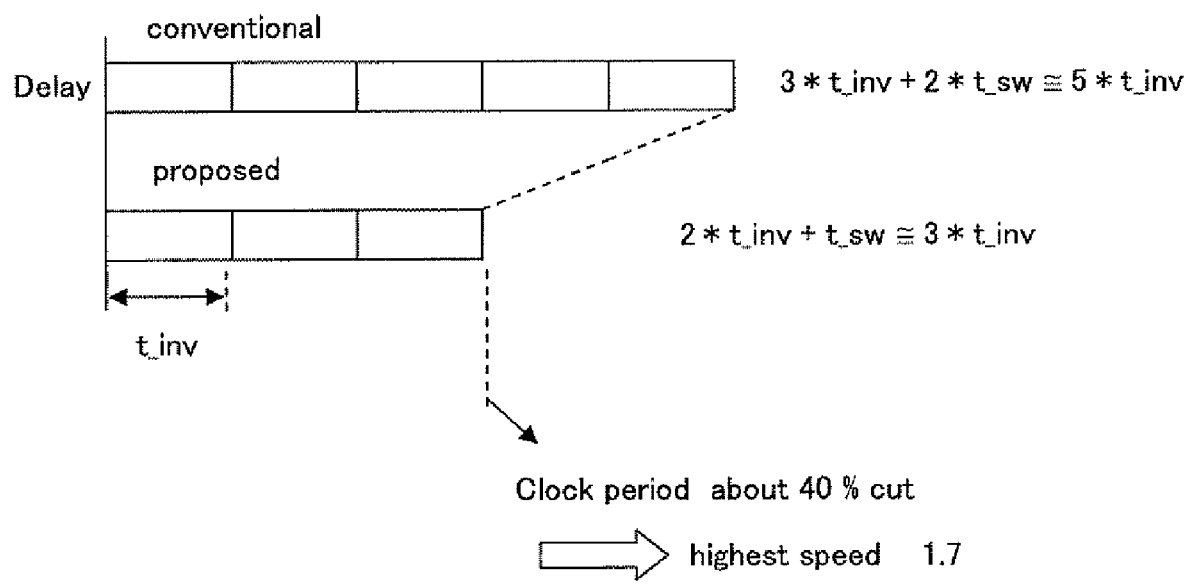
F I G. 11

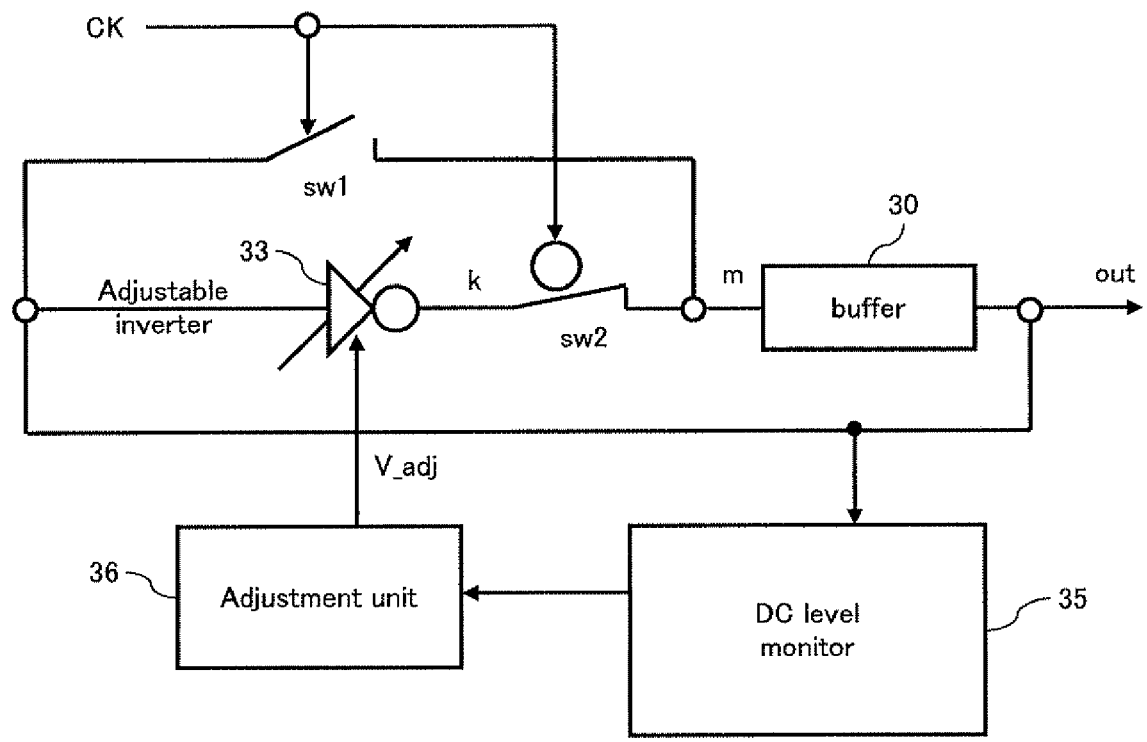
F I G. 14

F I G. 1 5 A          F I G. 1 5 B

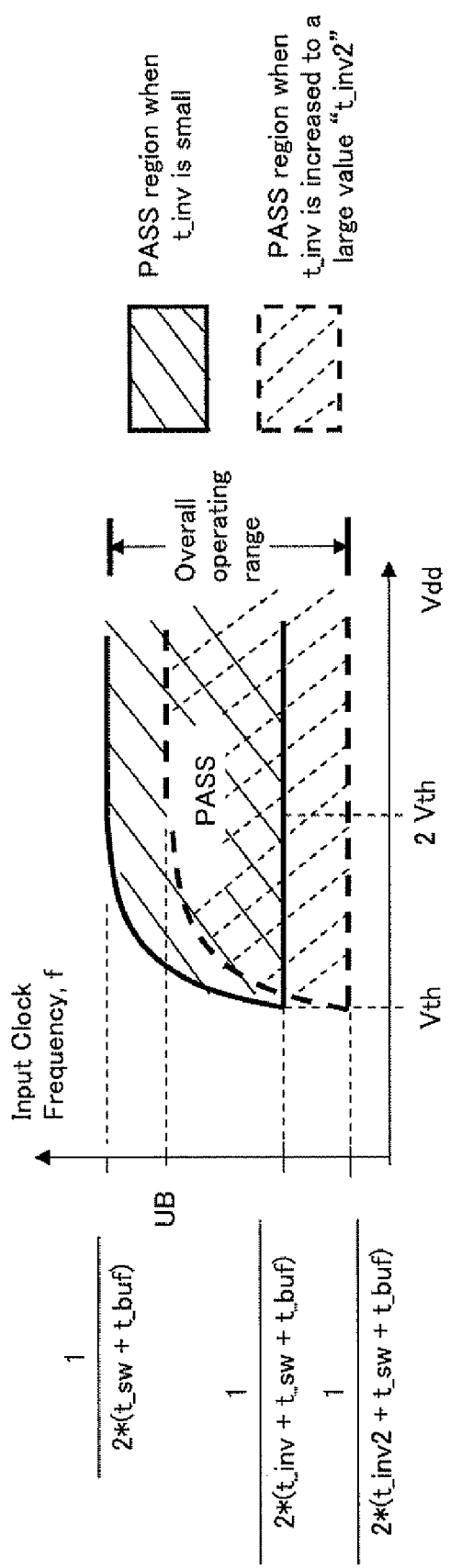
F I G. 1 8

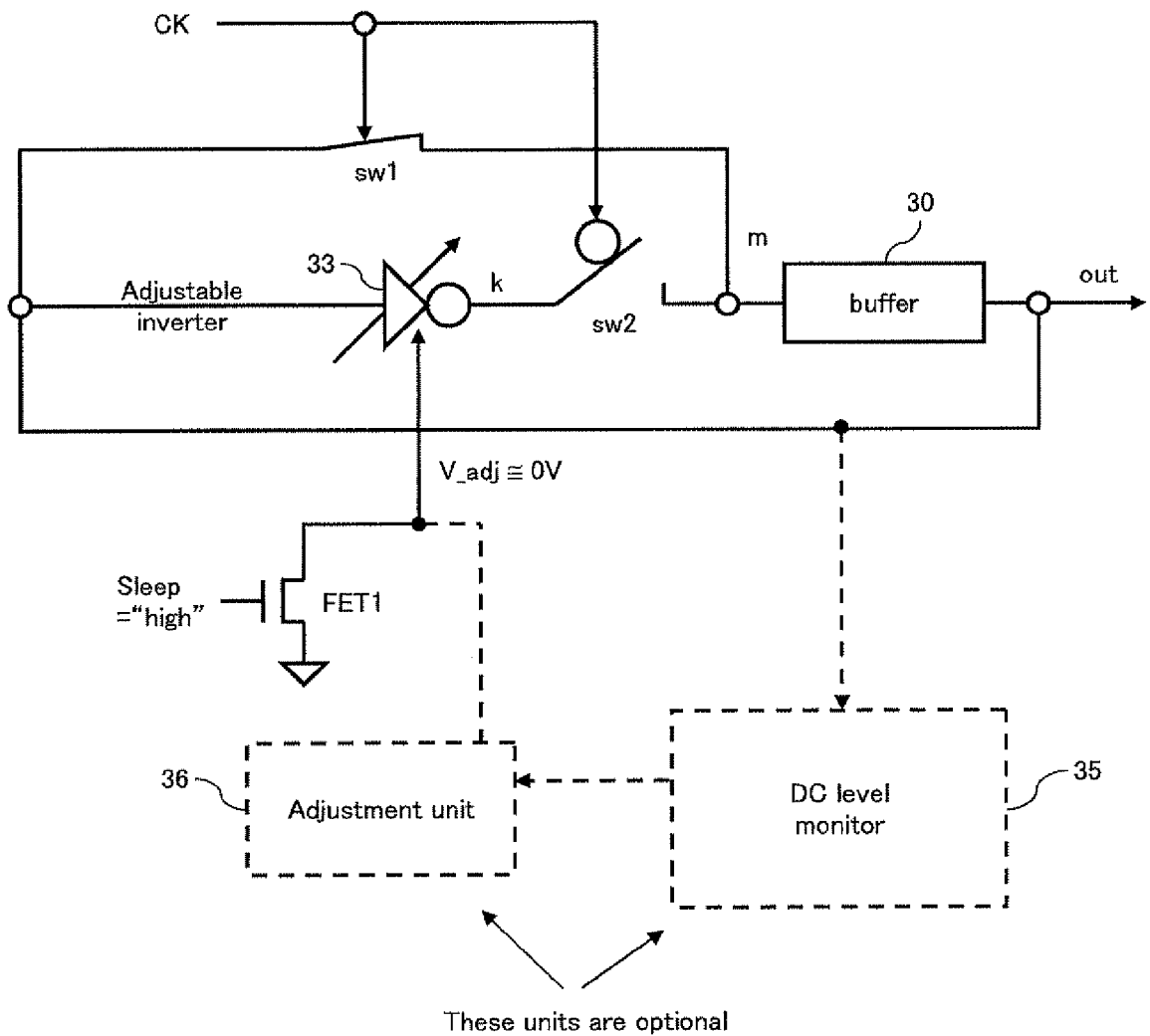
F I G. 19

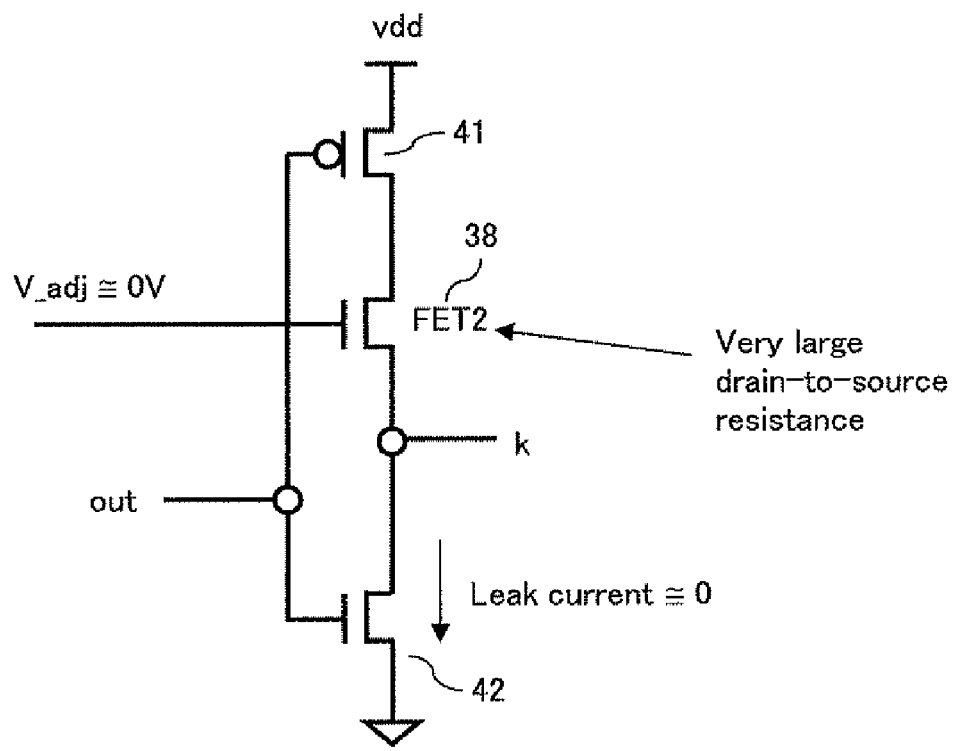
F I G. 2 0 A
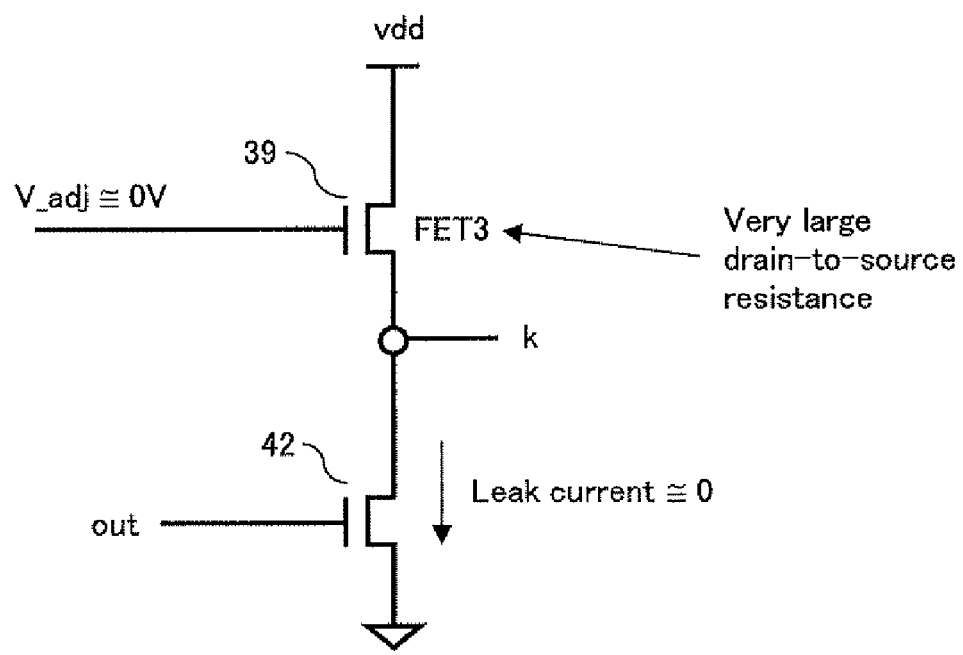
F I G. 2 0 B

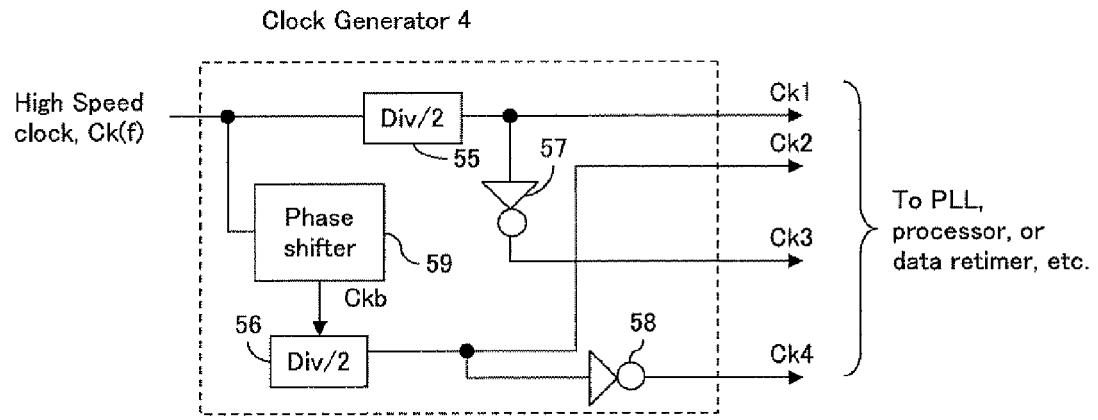
F I G. 2 6 A
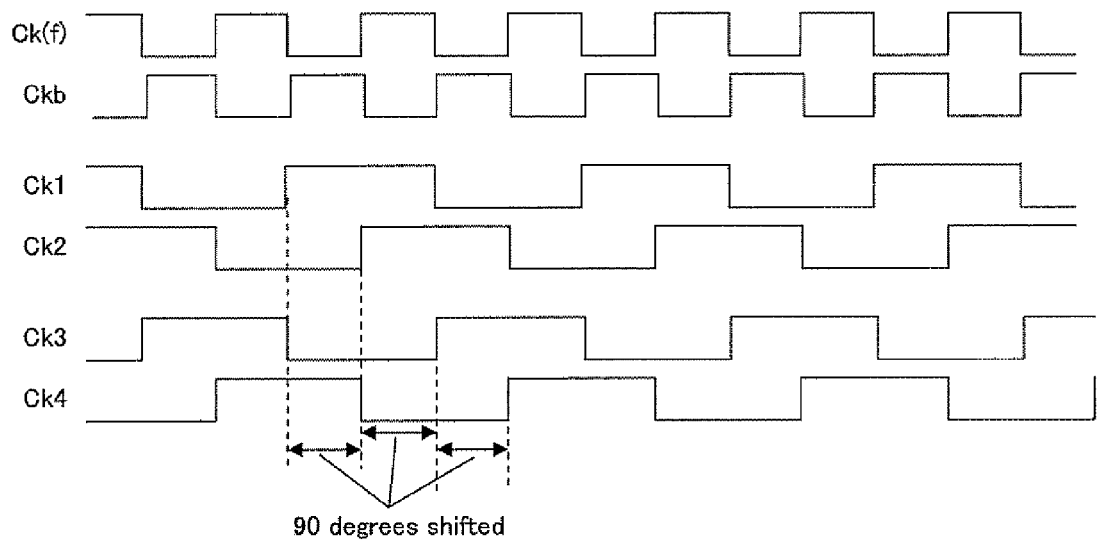
F I G. 2 6 B

HIGH SPEED DYNAMIC FREQUENCY DIVIDER

BACKGROUND OF THE INVENTION

1. Field of the Invention

The present invention relates to a structure of a dynamic frequency divider.

2. Description of the Related Art

Frequency Divider (FD) is an important building block which is widely used in logic systems and transmission systems, including phase locked loop (PLL), Clock Multiplication Unit (CMU), and clock generators (CkGen). The master-slave Toggle flip-flop (TFF) configuration is one of the most common types used in both dynamic and static frequency dividers. However, propagation delays of logic gates and switches in the TFF limits the maximum operation frequency. Especially in CMOS and BiCMOS processes, there is not yet a high enough operating frequency range for high data rate applications like the 40 Gbps transmission systems.

FIGS. 1 through 4 depict the conventional frequency divider.

A conventional FD (conv. FD1) uses master-slave buffer elements, but the highest operation frequency is limited. Another conventional FD (conv. FD2) uses an analog mixer (or analog multiplier), but the circuit configuration cannot operate very fast if standard CMOS process is used.

Circuit shown in FIG. 1 is a conventional frequency divider (FD1) with two switches sw1 and sw2 that are alternatively controlled by an input clock signal (CK). In some articles, the frequency divider is called an edge-triggered master/slave Toggle flip-flop (TFF). The same clock is used to drive both level-triggered TFF with opposite logic.

The operation of FD1 is mainly determined by shuffling the voltage level of CK signal, activating only one buffer, 10 or 11, at the same moment, while another buffer holds the voltage level in the previous CK period. The inverted output by the inverter 12 is fed back to the input port "outb". (In other words, the inverter 12 is to invert "out" value such that "out" will change its value in the next period.) The first buffer 10 is commonly called the master buffer and the second one 11 is normally referred to as the slave buffer. Either the master buffer 10 or the slave buffer 11 is activated in each half-clock cycle, ensuring that not both buffers will change their output values at the same time (because of the switches between them). As shown in FIG. 2, "out" will change its value once while CK changes from 1 to 0. In other words, the output clock signal "out" is a frequency that is half that of "CK".

As shown in the timing diagram in FIG. 2, there is time restriction to the above circuit such that T(CK=1) should be larger than (t_sw+t_buf), and T(CK=0) should be larger than (t_sw+t_buf+t_inv). Wherein t_sw is a delay time of switches sw1 and sw2, t_buf is a delay time of buffers 10 and 11 and t_inv is a delay time of the inverter 12. As a result, the maximum frequency must be less than 1/(2*(t_sw+t_buf)+ t_inv). The input clock frequency cannot be higher than this value. Otherwise, the outputs (k' and out) do not have enough time to toggle, and the output will be stuck to the initial value or the value in the previous CK period.

FIG. 3 shows another conventional FD, conventional FD2, which contains a mixer/multiplier 15, a low pass filter (LPF) 16 and an amplifier (AMP) 17. Frequency values of the input CK signal, output of the mixer/multiplier 15, output of the LPF 16, and output of the conventional FD2 are denoted by fc, fc±fo, fc−fo, and fo, respectively. In this circuit, an analog mixer, or multiplier 15, is used to modulate the input CK with the output such that mixer's output contains frequency harmonics of (fc+fo) and (fc−fo). By using the LPF 16, only the lower harmonic (fc−fo) is passed to the AMP 17, which amplifies the signal as output.

The stable condition (or lock condition) of this circuit can be expressed by $$fo=fc-fo \qquad \text{equation (1)},$$

where fc is frequency of input CK, and fo is frequency of output of the FD.

The above equation implies that $$fo=fc/2 \qquad \text{equation (2)},$$

which indicates function of a frequency divider (The above circuit is called "Miller divider" in some articles.).

An example of implementation of this circuit is shown in FIG. 4, in which GaAs bipolar transistors are used. All signal paths, including internal nodes, are in differential mode, such that there are {fc, fcb} at the clock input and {fo, fob} at the output, where fcb is a negation of fc and fob is a negation of fo. Firstly, the differential inputs {fc, fcb} are connected to two resistors 20 and 21, which are part of a DC biasing circuit. This biasing circuit adjusts {fc, fcb}'s voltage to a suitable level for the high speed mixer (or "Gilbert" multiplier) 22. This FD can achieve high frequency operation due to the high performance of the "Gilbert" style multiplier 22. The parasitic capacitances at nodes "x" and "y" (resulting from collector nodes of Q3-Q6 and base nodes of Q7-Q8), along with load resistors (Rx and Ry), form the low pass filter. The three cascaded emitter followers 23 further perform amplification and wave-shaping. "fo" and "fob" are fed back to transistors Q1 and Q2, respectively. High speed operation of this FD comes from that high speed mixer and high gain amplifier and can be implemented readily with bipolar transistors such that this circuit can operate at high frequency "Input CK". If standard CMOS process is used, such configuration is difficult to design, and high speed operation cannot be achieved.

The input frequency at "Input" can be as high as f_miller=1/(Rx*Cx), where Cx is the total parasitic capacitance at node "x", and Rx is the resistance value of RX. For typical bipolar circuits, typical values of Cx and Rx are 0.50 pF and 50 ohm, respectively. Thus, the f_miller value of bipolar implementation is 40 GHz. However, for a typical CMOS circuit, typical values of Cx and Rx are 1.00 pF and 200 ohm, respectively. (The higher value of Rx is necessary to maintain adequate gain of the "Gilbert" multiplier.) Thus, the f_miller value of CMOS implementation is 5 GHz.

In the application of compact transmission systems or portable terminals, power consumption becomes an important concern such that CMOS LSI is often preferred. In cases of high data rate applications like 40 Gbps transmission systems, a FD which operates at 20 GHz is required. If the FD is implemented in standard CMOS process, both the power consumption and the fabrication cost can be lowered.

The total internal propagation delay is large in conventional master-slave type frequency divider (FD) such that maximum operating frequency is limited. On the other hand, high speed frequency dividers consume high power if fabricated with bipolar transistors and high frequency is difficult to achieve when using standard CMOS process.

SUMMARY OF THE INVENTION

The object of the present invention is to provide a high speed dynamic frequency divider which operates faster and at a low power consumption.

The frequency divider of the present invention is a frequency divider comprising: a function selector unit selecting a signal so that the selected signal in one of two feedback paths is dominantly input to a buffer unit, in synchronous with a clock signal frequency of which satisfies a certain condition; the buffer unit buffering the signal input from the function selector unit and outputting the buffered signal; the two feedback paths feeding back the output signal of the buffer unit to an input of the buffer unit; and an inverter unit provided in one of the two feedback paths and inverting a signal value.

The FDs of the present invention shorten the total internal propagation delay such that the maximum input clock frequency is extended. The FD circuits of the present invention have the advantages of high speed operation, applicability in CMOS configuration, and small circuit size. It is also promising in future compact high data rate applications like 40 Gbps transmission systems or portable terminals.

BRIEF DESCRIPTION OF THE DRAWINGS

FIGS. 5A and 5B show the frequency dividers of the embodiments of the present invention
FIGS. 7A and 7B show the operation of the frequency divider of the embodiment of the present invention with the function selector of Example 1 (1)
FIGS. 9A and 9B show the operation of the frequency divider (FD1) of the embodiment of the present invention with the function selector of Example 2 (1)
FIG. 11 shows a comparison of clock periods (delays) between conventional frequency divider and the embodiment of the present invention
FIG. 14 shows the configuration of the frequency divider according to another embodiment of the present invention
FIG. 18 shows the theoretical operating range of the frequency divider with DC Level monitor according to the embodiment of the present invention
FIG. 19 shows the configuration with the Stand-by (Sleep) mode of frequency divider of FIG. 7 (with function selector of Example 1 in FIG. 6A)
FIGS. 20A and 20B show the adjustable inverter used for the configuration of FIG. 19
FIGS. 26A and 26B show another application of the present invention to a multi-phase clock generator
FIGS. 27A and 27B explain a "Divide-by-$2^m$" frequency divider as an application of the present invention

DESCRIPTION OF THE PREFERRED EMBODIMENTS

Figure 1:
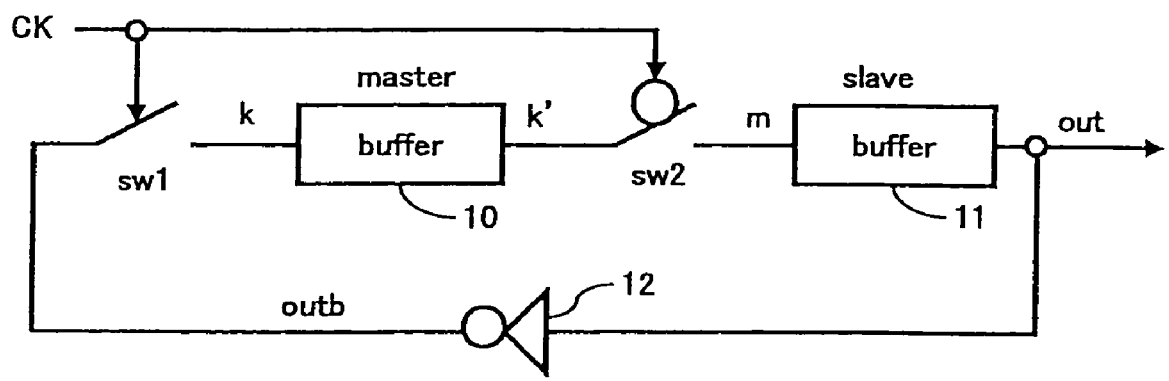
FIG. 1 explains the conventional frequency divider (1)
FIG. 2 explains the conventional frequency divider (2)
FIG. 3 explains the conventional frequency divider (3)
FIG. 4 explains the conventional frequency divider (4)
Figure 2:
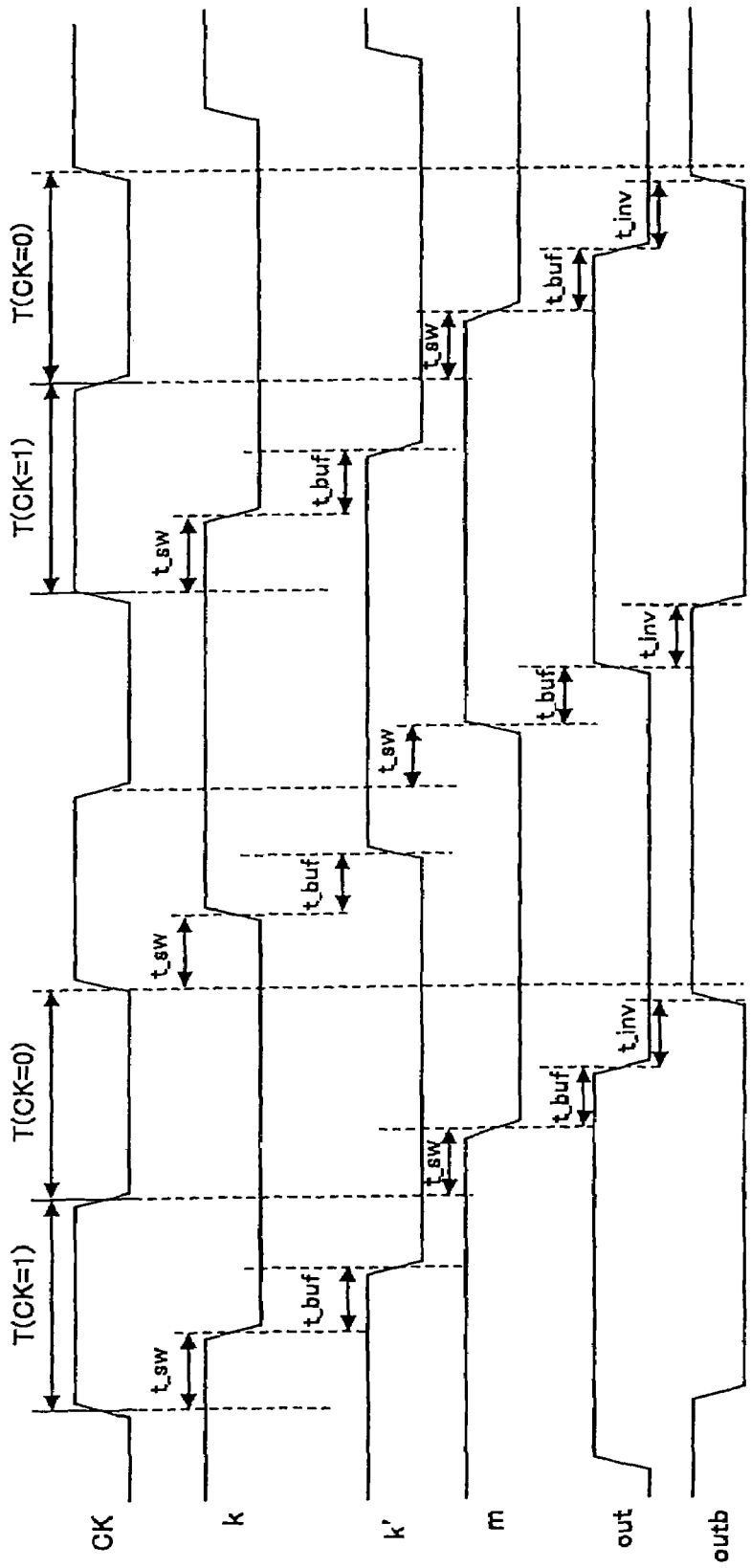
Figure 3:
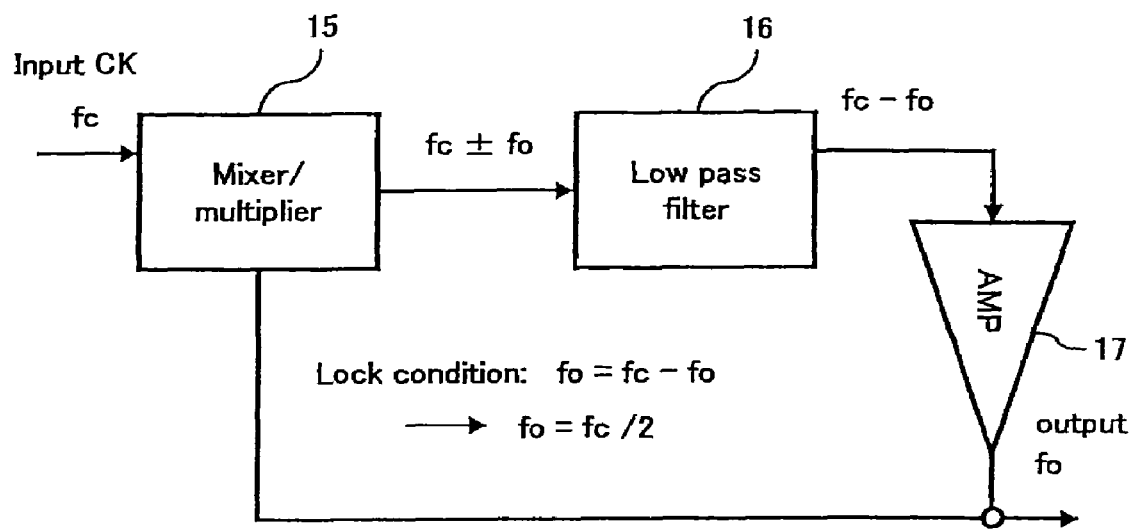

The FD of the present invention may be embedded in integrated circuits or be built with discrete elements. The FD of the present invention is also applicable to Clock Data Recovery (CDR) systems, logic systems (like ripple counters or ring counters), and/or transceivers, in which periodic clocks and/or signals are used to synchronize (retime) input data or internal data. In the frequency divider of the present invention, when the input clock signal (CK) is of logical "high", one of the switches will close and the circuit will perform as a ring oscillator (oscillates once or flips). After a certain time period, the output value will begin to toggle and then completely change to a value that is the negation of the previous "output" value. When the input clock signal (CK) is of logical "low", the corresponding switch will be turned off such that the updated output value can be held. However, since the CK signal should change to turn off the switch before the circuit oscillates more than once or flips more than once, there is a limitation that the period of "low" CK must be less than the total propagation delay in the FD of the present invention. In other words, the minimum frequency of CK must be larger than half of the intrinsic oscillating frequency of the FD of the present invention.

A monitor circuit is also proposed to adjust the mentioned intrinsic oscillating frequency such that the overall operating frequency range can be widened.

Although the FD circuit of the present invention is a dynamic frequency divider to which continual CK signal should be inputted to ensure validity of its output value, power saving "stand-by" mode is possible if a logic circuit is installed to monitor and to control the output value during the "stand-by" mode.

The FD of the present invention uses the concept of a function selector that switches signal paths with a buffer and an inverter in a circuit. (The function selector can also switch a signal bi-directionally.)

FIGS. 5A and 5B show the frequency dividers of the embodiments of the present invention (New FD1 and New FD2) in which (i) only one buffer 30 is used, and (ii) function selector (switches or MOSFET transistors) 31 is used to change signal path for the input ("m" in FIG. 5A, "j" in FIG. 5B) to the buffer.

FIGS. 6A through 6D show four example structures of the function selector. Example 1 of FIG. 6A uses two switches, "sw1" and "sw2", which are controlled by the CK signal. When CK is logically "high" (or CK=1), "sw1" will be closed (turned on) and "sw2" will be opened (turned off). When CK is logically "low" (or CK=0), "sw1" will be opened (turned off) and "sw2" will be closed (turned on). In this example, only one switch will be closed at a time.

Using the function selector of Example 1, the operation of the circuit shown in FIG. 5A is explained. When CK is "high" sw1 is closed and sw2 is opened. The function selector 31 selects the path comprising input j, output m, and the buffer 30. This path does not include the inverter, which means the value of the buffer 30 is locked. When CK turns to "low", the function selector 31 selects the path comprising the inverter 32, input k, output m and the buffer 30. As this path includes the inverter 32, the output of the buffer 30 "out" is inverted by the inverter 32 to "outb". This outb is input to the buffer 30. This operation inverts the value of the buffer 30. If CK turns back to "high" before the value of the buffer 30 is inverted again, the function selector 31 changes to select the path not including the inverter. This means, the once inverted value of the buffer 30, is locked. As apparent from the above explanation, with one cycle of the CK, the value of the buffer 30 changes from "high" to "low" or "low" to "high" once. Therefore, with the two cycles of the CK, the value of the buffer 30 turns back and forth once, which means the circuit of the FIG. 5A is the frequency divider which divides the frequency of the CK by 2. The operation of the circuit of FIG. 5B with the function selector shown in FIG. 6A is the same.

Example 2 uses one switch, "sw1", which will be opened when CK=0 and be closed when CK=1. When "sw1" is opened, the signal path is from "k" to "m", and the FDs of FIG. 5 work as oscillators. When "sw1" is closed, the voltage level of "m" will approximately equal to that of "j", and the FD functions as a buffer. While the inverter's input voltage level will equal that of "j", its output voltage level will equal that of "m".

Figures 6A, 6B, 6C, 6D:
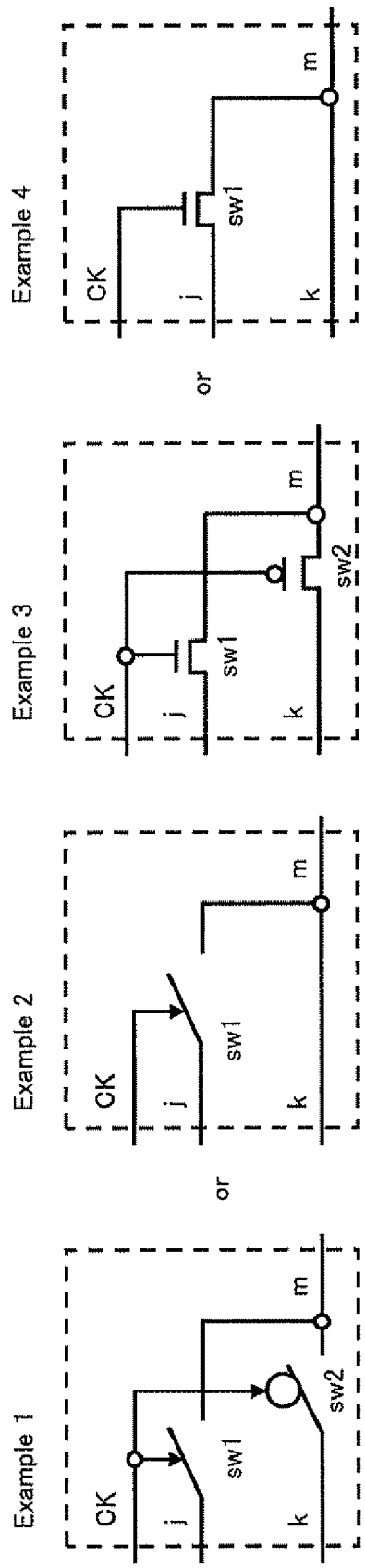
FIGS. 6A through 6D show four example structures of the function selector

FIGS. 6C and 6D show two example structures of the function selector which uses CMOS transistors as switches of FIGS. 6A and 6B. In Example 3, when CK=1, "sw1" will be turned on and "sw2" will be turned off; and when CK=0, vice versa. In Example 4, when CK=1, "sw1" will be turned on; and when CK=0, "sw1" will be turned off. In this example, voltage difference between "j" and "m" will be approximately equal to the MOSFET threshold voltage of sw1, when CK=1. On the other hand, when CK=0, the voltage difference can be as high as Vdd, the supply voltage of the circuit.

Figure 8:
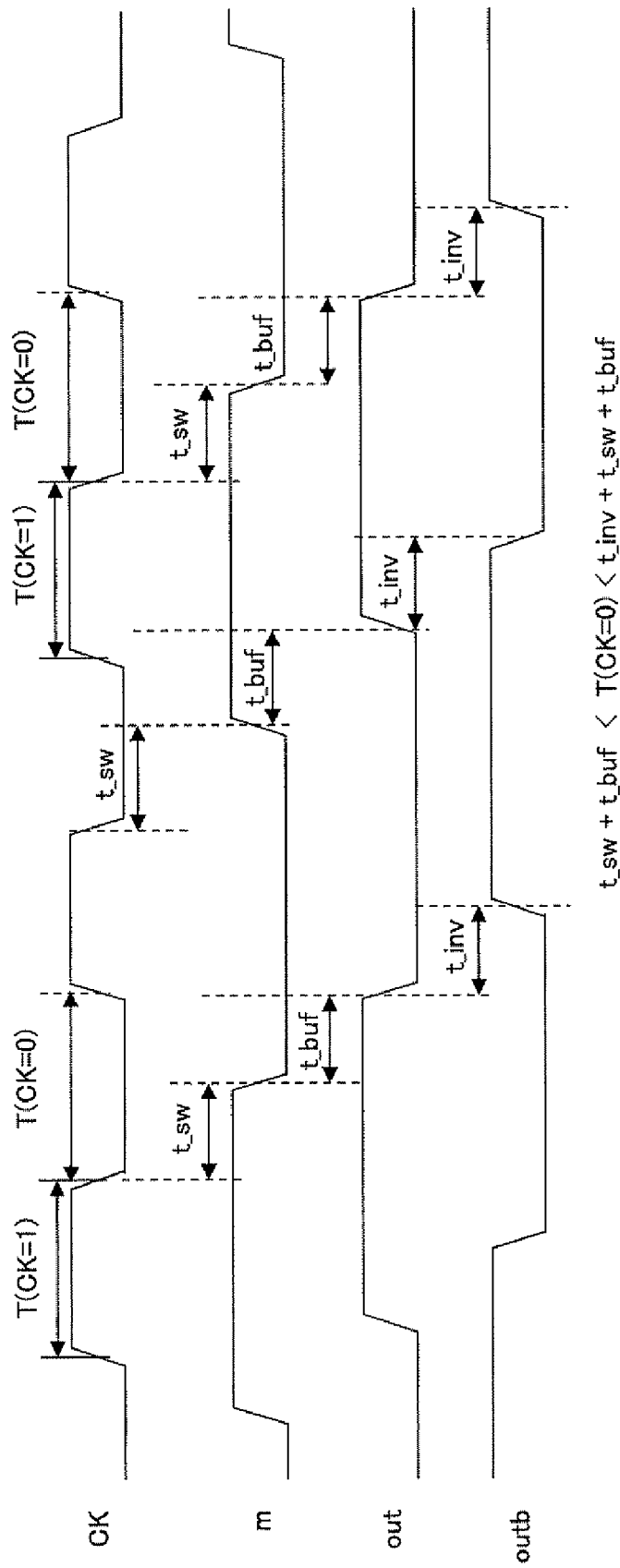
FIG. 8 shows the operation of the frequency divider of the embodiment of the present invention with the function selector of Example 1 (2)

FIGS. 7 and 8 show the operation of the frequency divider of the embodiment of the present invention with the function selector of Example 1. When CK is of logical "0", the switch sw2 closes and the circuit operates as a ring oscillator. After a time period of (t_inv+t_sw), the output value (out) begins to toggle and after a time of (t_inv+t_sw+t_buf), "out" will completely change to a value that is the negation of the previous "out" value. The CK signal should turn off sw2 before signal "m" changes its value again. As a result, there is a limitation that T(CK=0) must be less than (t_inv+t_sw+t_buf), where T(CK=0) is the time period while CK is logically "0".

When CK is of logically "1", sw1 will be turned on and the circuit operates as a stabilized loop. The value of signal "m" is duplicated to "out", and the new value of "out" further stabilizes "m". The condition for proper operation is that T(CK=1) must be larger than (t_sw+t_buf), where T(CK=1) is the time period while CK is logically "1".

Mathematically, $$t\_sw+t\_buf < T(CK=0) < t\_inv+t\_sw+t\_buf \quad \text{equation (3)},$$

where t_inv=propagation delay of inverter, t_sw=propagation delay of switch, t_buf=propagation delay of buffer.

The value of 1/(t_inv+t_sw+t_buf) can be termed as the intrinsic oscillating frequency of the FD. If the input clock signal has a 50% duty cycle, the minimum frequency of CK must be larger than half of the intrinsic oscillating frequency of the FD of the embodiment of the present invention to ensure proper operation.

Mathematically, $$1/(2*(t\_inv+t\_sw+t\_buf)) < f < 1/(2*(t\_sw+t\_buf)) \quad \text{equation (4)},$$

where f=frequency of clock signal CK.

In the above example, t_buf is approximately equal to 2 times t_inv. If the input clock signal has a 50% duty cycle, the operating frequency ranges from about 1/(2*(t_sw+t_buf)) to 1/(2*(t_inv+t_sw+t_buf)). This frequency range is about twice the value of a conventional master-slave TFF frequency divider, if the values of t_sw and t_inv are approximately equal.

Note that although t_sw is a delay time of the switch, because the function selector is mainly configured by the switches, t_sw can also be considered as the delay time of the function selector.

Figures 10A, 10B:
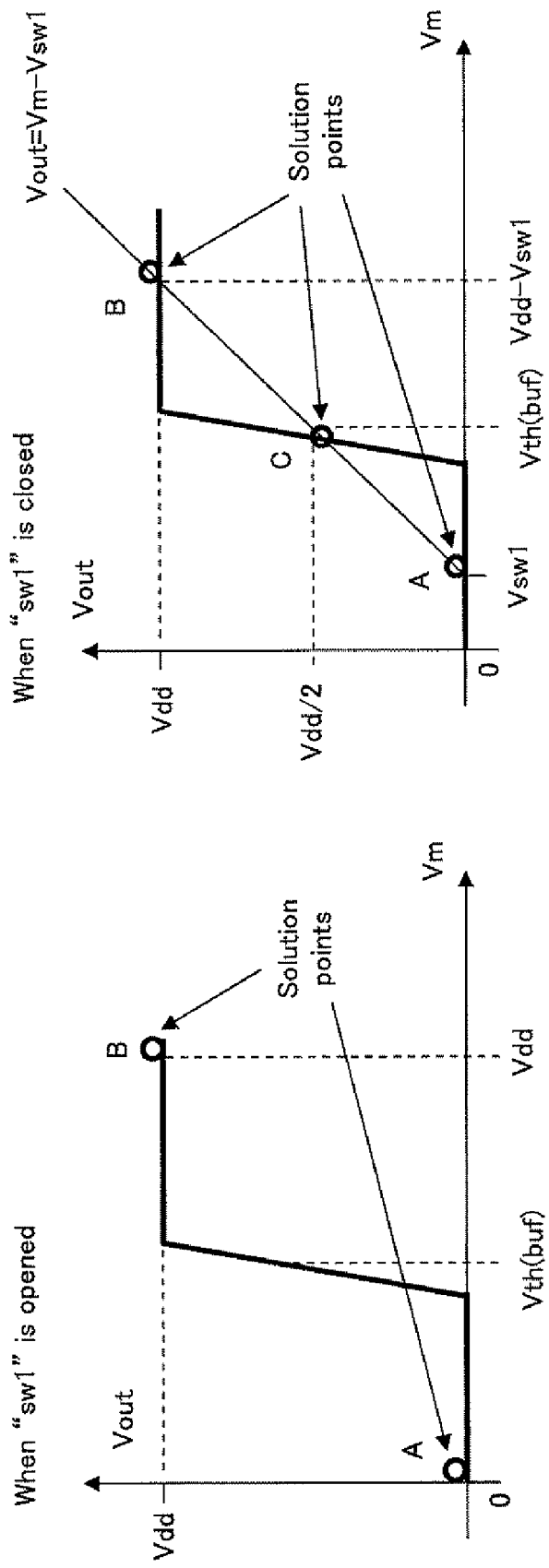
FIGS. 10A and 10B show the operation of the frequency divider (FD1) of the embodiment of the present invention with the function selector of Example 2 (2)

FIGS. 9 and 10 show the operation of the frequency divider (FD1) of one embodiment of the present invention with the function selector of Example 2. Similar to FIG. 7, the circuit repeats the functions of an oscillator and a buffer. When CK=0, sw1 is opened and the condition of the circuit is the same as in FIG. 7.

When CK=1, sw1 is closed. At this point, even though the input and output of the inverter form a closed loop, there is voltage difference between "out" and "m", due to voltage difference, Vsw1, at both terminals {j, m} of sw1. The voltage level at node "m" is given by $$Vm = Vout + Vsw1 \quad \text{equation (5)},$$

which implies that $$Vout = Vm - Vsw1 \quad \text{equation (6)},$$

where Vm is voltage at node "m",

Vout=voltage at node "out", and

Vsw1=voltage difference at both terminals of sw1.

When Vout is of "low" voltage, Vsw1 is usually of positive value. On the other hand, when Vout is of "high" voltage, Vsw1 is usually of negative value, that means a voltage drop.

A typical DC characteristic curve of the FD1 is shown in FIG. 10. The x-axis denotes voltage level at node "m" and the y-axis denotes voltage level at node "out". The characteristic curve of the "buffer" is plotted with bold line, and Vth(buf) is the threshold voltage of the buffer. As Vm is smaller than Vth(buf), Vout will be at voltage "zero"; and as Vm is larger than Vth(buf), Vout will be at voltage "Vdd".

When "sw1" is opened and equation (3) is satisfied, the inverter will operate without restriction such that Vm will be at voltage level of either "zero" or "Vdd". Thus, the solution point of the FD1 will be at either "A" or "B". As long as equation (3) is satisfied, the inverter will generate a "Vm" value that is the negation (or inversion) of "Vout".

On the other hand, when "sw1" is closed, the inverter will not generate the negation value at node "m". Instead, voltage at "m" is given by equation (5) or equation (6), as discussed in regards to FIG. 9. When equation (6) is plotted as a line in FIG. 10B, three intersection points with the DC characteristic curve appear. The first point is "A", which indicates that Vm=Vsw1 and Vout=0. The second point is "B", which indicates that Vm=Vdd−Vsw1 and Vout=Vdd. The third point is "C", which indicates that Vm=Vth(buf) and Vout=Vdd/2.

Functionally, operation at either points "A" or "B" is similar to that as "sw1" is opened. The only difference is that Vm does not reach full swing of Vdd. Nonetheless, operation at point "C" indicates that the FD1's input "m" and output "out" will be instantaneously stabilized at Vth(buf) and Vdd/2, respectively. (This phenomenon is called "meta-stability" in some articles.) If such stability situation lasts for an un-negligible period as compared with T, "out" value cannot be determined and an error may occur.

To avoid the so-called "meta-stability" phenomenon, the gain (sometimes called the driving capability) of the buffer should be designed to be larger than that of the inverter, such that the voltage value of "out" will be at either "0" or "Vdd" even though there is slight variation in value of "Vm". In other words, if the gain of the buffer is large enough, the FD1 circuit will only operate at either solution points "A" or "B".

The operation mechanism and DC characteristics of the function selector of Example 4 is similar to those of the function selector of Example 2. However, if the function selector of Example 4 is used, the value of Vsw1 will be approximately equal to the "saturated" (or "turned on") drain-to-source voltage of the field effect transistor "sw1".

FIG. 11 shows a comparison of clock periods (delays) between the conventional frequency divider and an embodiment of the present invention.

By assuming that $t\_inv \cong t\_buf \cong t\_sw$, the delay in the conventional master-slave FD is approximately ($5*t\_inv$) while that of proposed FD is about ($3*t\_inv$). Because, in FIG. 1, there are two buffers, two switches and one inverter, the delay of the conventional master-slave FD is $5*t\_inv$. Additionally, in the embodiment of the present invention shown in FIG. 5, because there is only one buffer, one inverter and one switch, the delay is $3*t\_inv$. It implies a possible shrinkage of 40% in the clock period, which is equivalent to a 1.7 times increase in speed of the maximum operating frequency.

FIG. 12 shows an operation range of one embodiment of the present invention.

Figures 12A, 12B:
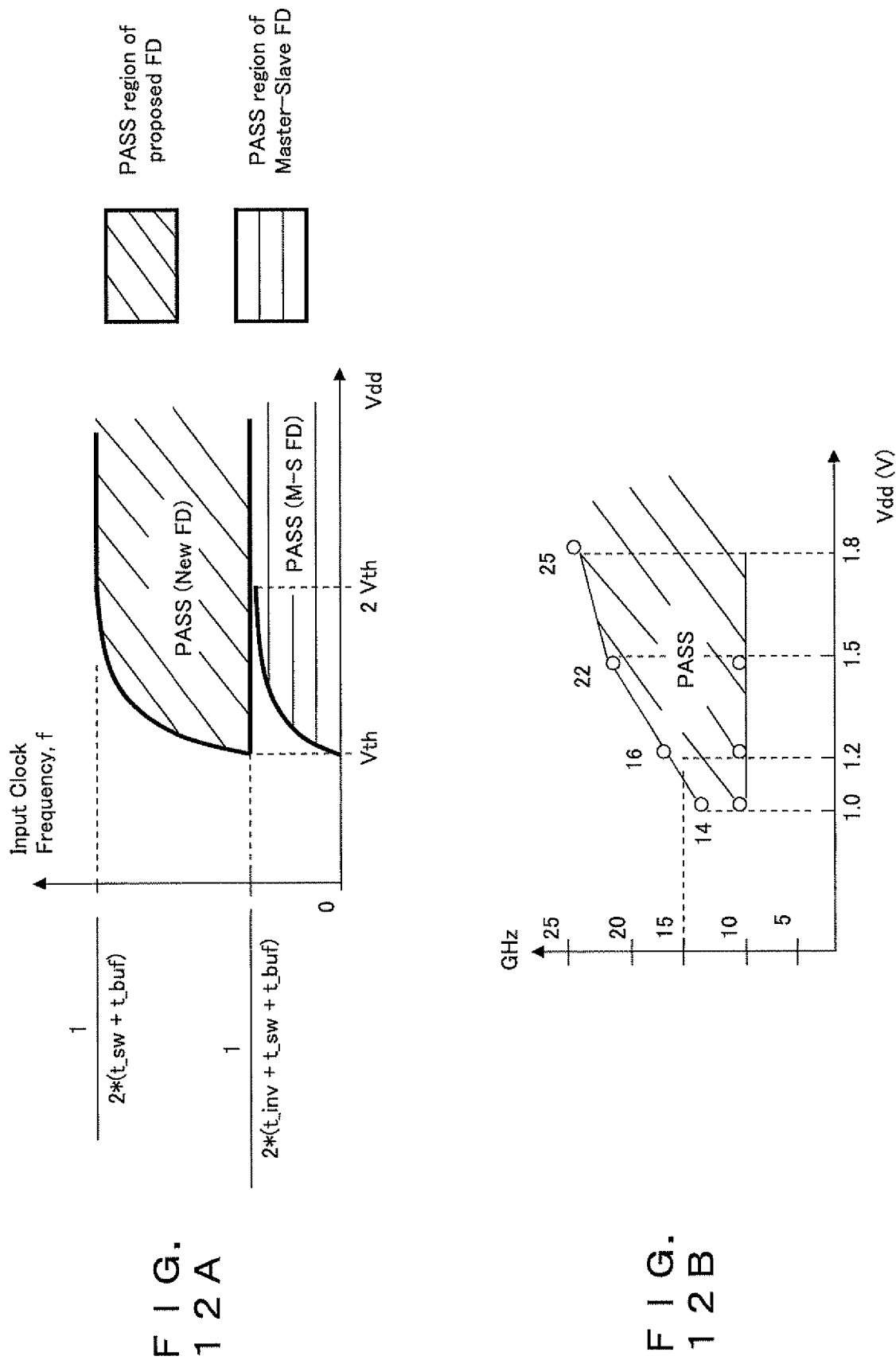
FIGS. 12A and 12B show operation range of the embodiment of the present invention

FIG. 12A shows a comparison of the theoretical operation ranges of the frequency divider of the embodiment of the present invention (New FD) and conventional master-slave frequency divider (M-S FD), under the condition of $T(CK=0)=T(CK=1)=2/f$. The x-axis represents the power supply voltage (Vdd) and the y-axis represents the input clock frequency (f). Vth denotes the threshold voltage of the inverter. Both types of circuits operate only if the supply voltage is larger than Vth. However, the delay of inverter is relatively large when Vdd is just larger than Vth. Usually, the inverter begins to operate at a faster speed when Vdd is larger than about twice of Vth.

The conventional M-S FD operates only at clock frequency under a constrained upper value, $1/(2*(t\_inv+t\_sw+t\_buf))$, even though there is no lower bound limit.

Mathematically, f(M-S FD), the operating frequency range of M-S FD, is given by $$0 < f(M\text{-}S\,FD) < 1/(2*(t\_inv+t\_sw+t\_buf))  \quad \text{equation (7)}$$

On the other hand, even though there are upper bounds and lower bounds on the operation range of the FD circuit of the present invention, the overall frequency is higher than the conventional M-S FD circuit.

FIG. 12B shows the simulation result of the frequency divider in FIG. 5A with function selector of Example 3 shown in FIG. 6C. Axes' representation is the same as FIG. 12A. Values in this graph are calculated with typical transistor delays using standard 90 nm CMOS parameters, like the SPICE BSIM4 parameters of Berkeley Predictive Technology Model (BPTM), University of California at Berkeley. When Vdd is higher than 1.5V, the operation frequency is higher than 22 GHz. Since the clock frequency of a 40 Gbps transmission system is of about 20 GHz, the circuit of the present invention will be of wide application in next generation communication systems.

Figure 13:
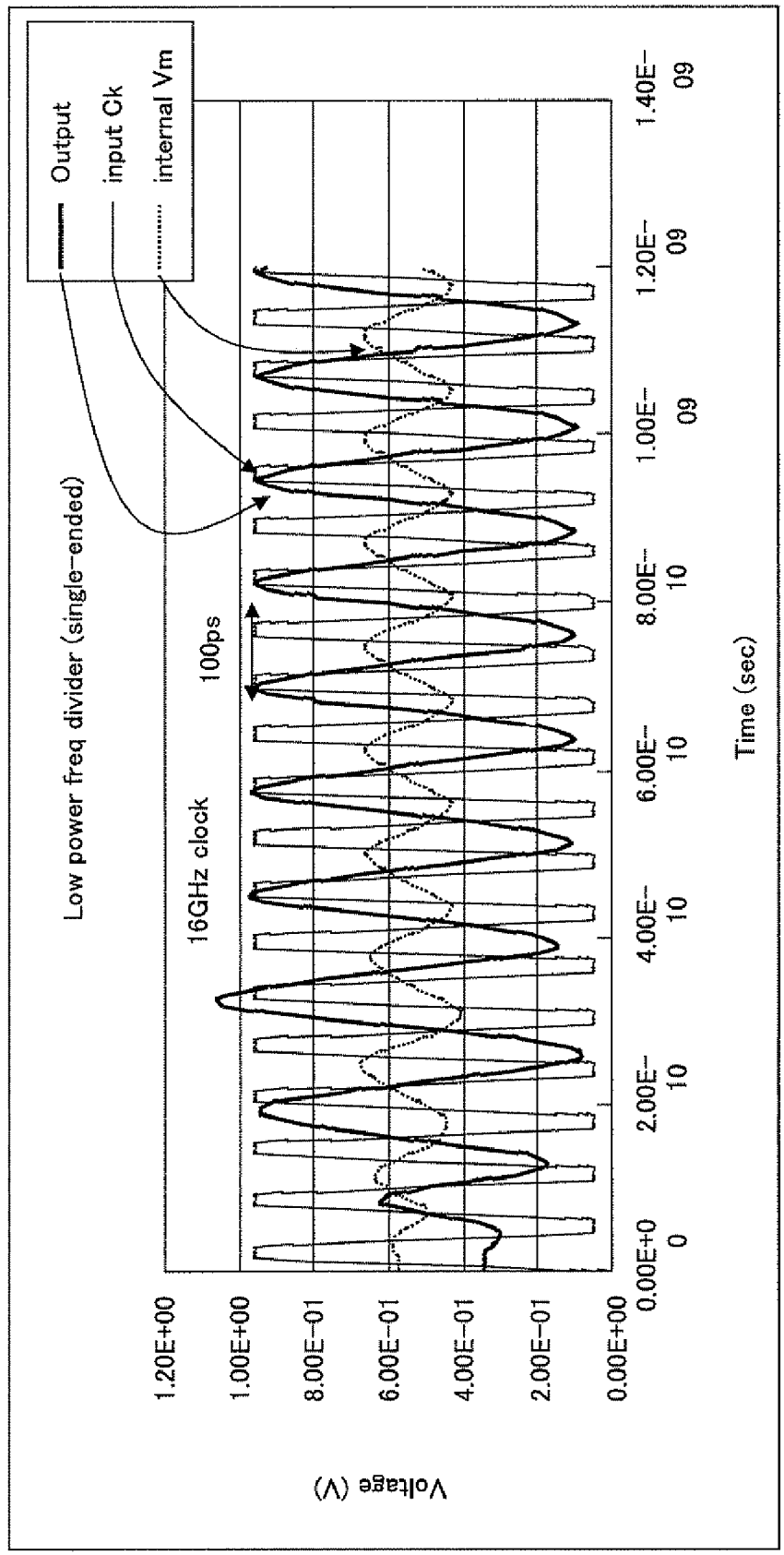
FIG. 13 shows the Spice Bsim4 simulation result with standard 90 nm CMOS process parameters

FIG. 13 shows the Spice Bsim4 simulation result with standard 90 nm CMOS process parameters. It shows the transient (time domain) waveforms of the circuit of the present invention (FIG. 7) at Vdd=1.2V. The circuit operates at 16 GHz while the amplitude of CK is Vpp(CK)=0.95 Vpp. It further reduces power consumption of the circuit because low swing in input signal saves more power. "internal vm" is equivalent to "m" in FIG. 7 and the peak-to-peak voltage swing is of about Vpp(CK)/4.

Although there is a lower bound limit to the frequency range of the FD of the present invention, the circuit shown in FIG. 14 can extend the operation range.

FIG. 14 shows a configuration of the frequency divider according to another embodiment of the present invention.

This circuit contains a DC level monitor 35 and an adjustment unit 36. The DC level monitor 35 detects the DC voltage of "out", and according to this DC level, the adjustment unit 36 determines whether to adjust the delay values "t_inv" of the adjustable inverter 33 or not.

Figure 15:
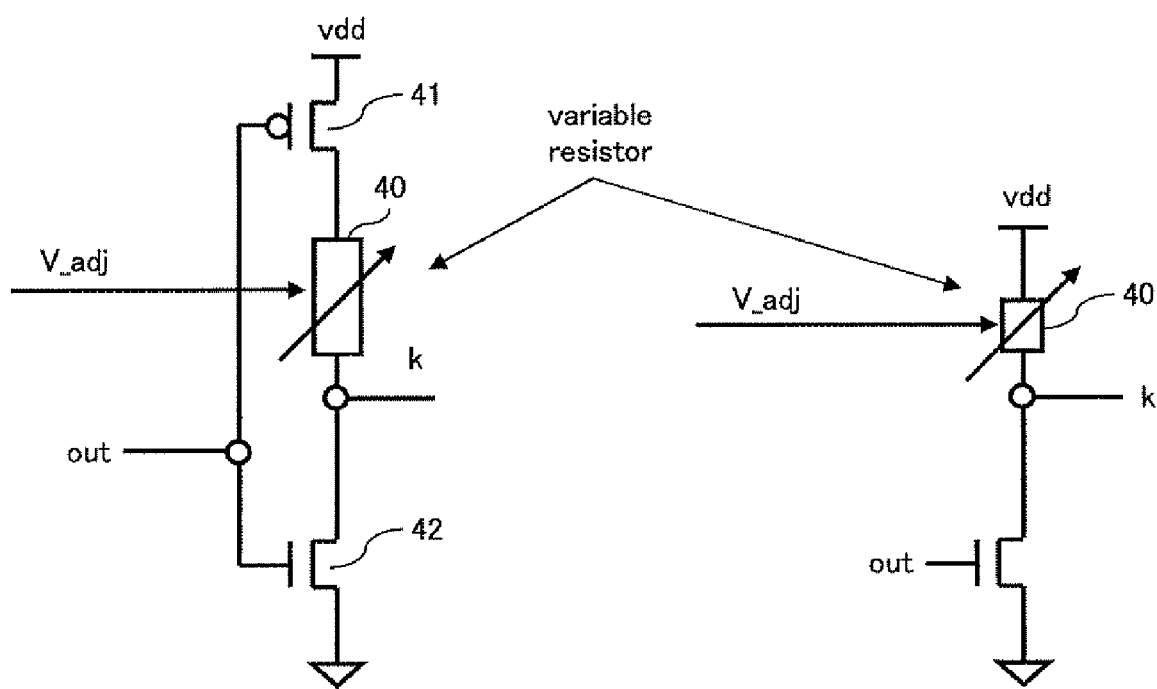
FIGS. 15A and 15B show two examples of CMOS inverter with adjustable delay

FIG. 15 shows two examples of CMOS inverters with adjustable delay.

In the adjustable inverter of FIG. 15A, a variable resistor 40 is inserted between the pMOSFET and nMOSFET transistors 41 and 42 to adjust the propagation delay of the inverter. In the adjustable inverter of FIG. 15B, a variable resistor 40 is used as an active load of an nMOS inverter to adjust its propagation delay.

Figure 16:
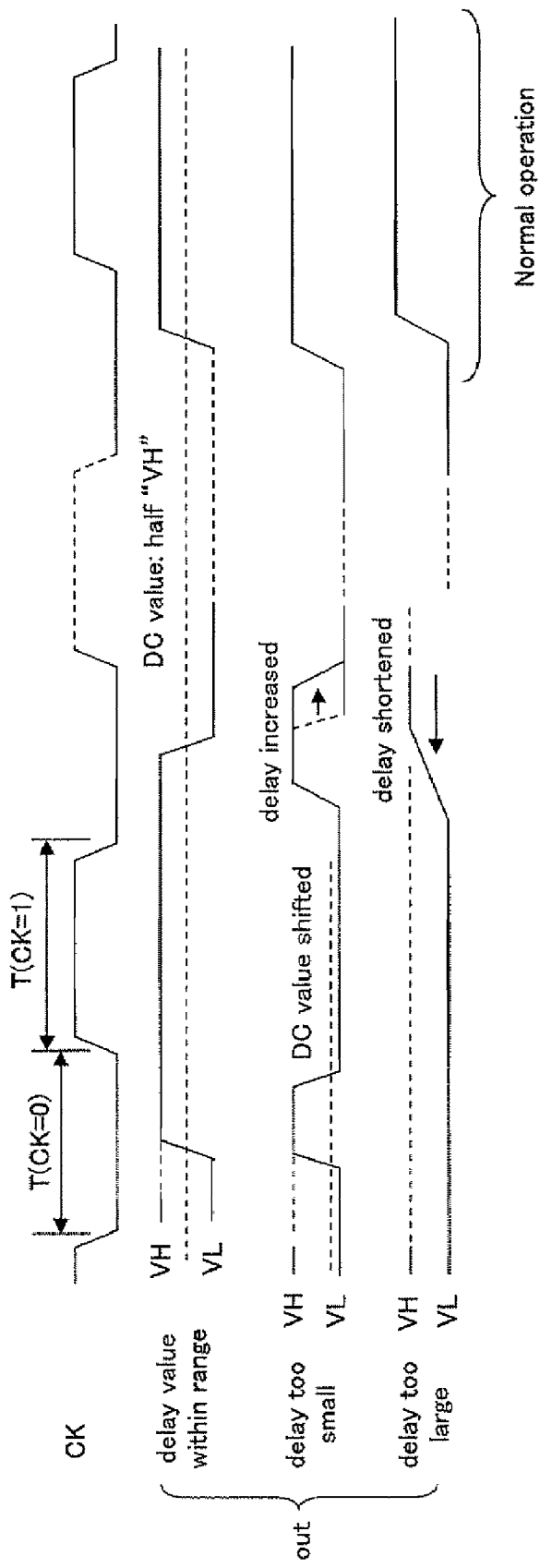
FIG. 16 shows the timing diagram of the inverter with adjustable delay
FIG. 17 explains the constraint of the embodiment of the present invention, with adjustable delay in the inverter

FIG. 16 shows the timing diagram of the inverter with adjustable delay.

Let us denote "VH" and "VL" to be the "high" level and "low" level voltages, respectively. When equation (3) is satisfied, the total delay is within operation range and normal frequency division is performed. The output "out" is of 50% duty cycle and its DC voltage is approximately equal to "VH/2", half of logical "high" level voltage. The adjustment unit will maintain the value of "V_adj" such that the normal operation will continue.

When the total delay (t_inv+t_sw+t_buf) is smaller than T(CK=0), "out" will toggle twice and return to the original value during the (CK=0) period. The resulting DC voltage detected by DC level monitor 35 would not be at "VH/2". By varying V_adj, the adjustment unit 36 can increase the delay of the adjustable inverter until normal operation is achieved.

On the other hand, if (t_inv+t_sw+t_buf) is too large such that no toggling occurs during the (CK=0) period, "out" will be stuck at either "VH" or "VL", both of which can be readily detected by the DC level monitor 35. By shortening the delay of the adjustable inverter through V_adj, the operation can return to normal eventually.

Figure 17:
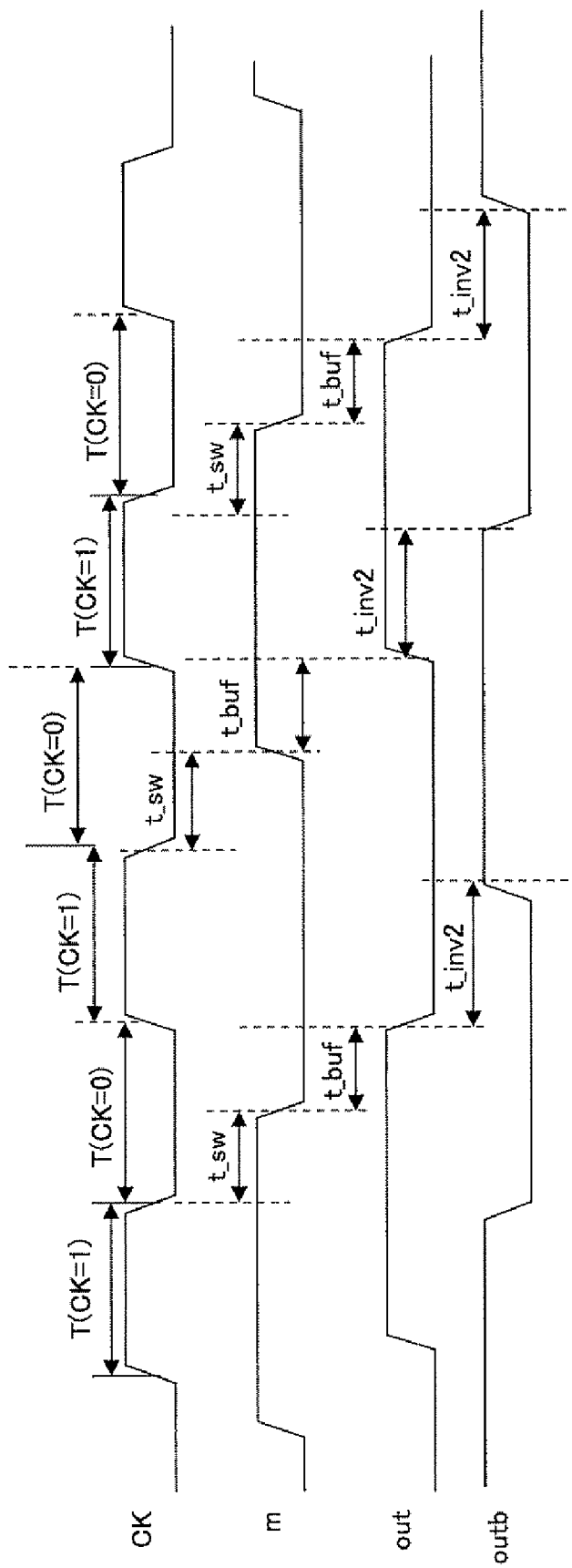

FIG. 17 explains the constraint of the embodiment of the present invention, with adjustable delay in the inverter.

As shown in the timing diagram FIG. 17, T(CK=0) is restricted by the following equation $$t\_sw+t\_buf < T(CK=0) < t\_inv2+t\_sw+t\_buf \quad \text{equation (8)}$$

where t_inv2=propagation delay of the adjustable inverter,
t_sw=propagation delay of switch,
t_buf=propagation delay of buffer.

When CK with 50% duty cycle is used, T(CK=0)=T(CK=1), and then f=1/(2*T(CK=0)). The following equation is derived.

$$1/[2*(t\_inv2+t\_sw+t\_buf)] < f < 1/[2*(t\_sw+t\_buf)] \quad \text{equation (9)}$$

On the other hand, when the adjustable inverter's delay "t_inv2" is large, there is a possibility that the total propagation delay of (t_inv2+t_sw+t_buf) may be larger than the clock period T. Thus, when T=T(CK=0)+T(CK=1) the circuit is restricted by the following equation $$t\_inv2+t\_sw+t\_buf < T(CK=0)+T(CK=1) < 2*(t\_inv2+t\_sw+t\_buf) \quad \text{equation (10)}$$

Expressed in frequency f, $$1/[2*(t\_inv2+t\_sw+t\_buf)] < f < 1/(t\_inv2+t\_sw+t\_buf) \quad \text{equation (11)}$$

Combining equation (9) and equation (11), we get $$1/(2*(t\_inv2+t\_sw+t\_buf)) < f < UB, \quad \text{equation (12)}$$

where UB=min{1/(2*(t_sw+t_buf)), 1/(t_inv2+t_sw+t_buf)}.

When t_inv is increased to a larger value "t_inv2", the value of the upper bound should be modified as UB, which is a value with stricter conditions to ensure proper operation, as shown in FIG. 18.

As a result, by installing the DC Level monitor 35 and adjustment unit 36, the overall operating frequency range of the FD circuit will be extended to the union of equation (5) and equation (12), as follows, $$1/(2*(t\_inv2+t\_sw+t\_buf)) < f < 1/(2*(t\_sw+t\_buf)) \quad \text{equation (13)}$$

FIG. 18 shows the theoretical operating range of the frequency divider with DC Level monitor according to an embodiment of the present invention.

Similar to FIGS. 12A and B, the x-axis represents Vdd while the y-axis represents f. In this figure, t_inv2 and t_inv denotes the maximum and minimum propagation delays of the adjustable inverter, respectively. The solid line shaded region denotes the pass region while there is a delay value of "t_inv" in the adjustable inverter. The dotted line shaded region denotes the pass region while the delay is "t_inv2". Since the delay value is automatically adjusted by the loop of DC level monitor and Adjustment unit, the FD of the embodiment of the present invention operates at the whole region of the shaded parts. Quantitatively, the FD circuit functions in the "overall operating range" as expressed by equation (13), and the overall operation range is wider than those of FD's as shown in FIG. 7 or 9.

In LSI technology, those operational conditions are affected by Vdd, temperature, and process parameters, etc. With DC Level monitoring, the FD circuit can operate properly regardless of whether the elements (switches, buffer, and inverter) are in good operational condition or not. Good operational conditions are also termed as "Best case" or "Fast case". (as contrast to "Normal case" in ordinary condition, and "Worst case" in bad condition.) The widened operation range is especially useful while the circuit is implemented with fabrication processes that generate intrinsic parameter deviation, like CMOS process with short gate length (say, gate length less than about 0.5 um).

FIG. 19 shows the configuration with the Stand-by (Sleep) mode of frequency divider of FIG. 7 (with function selector of Example 1 in FIG. 6A). In this configuration, the DC level monitor 35 and the adjustment unit 36 are optional. This two optional units should be added if a wider operating frequency range is desired. FIG. 20 shows the adjustable inverter used for the configuration of FIG. 19.

An nMOS transistor "FET1" 37 with gate connected to a "Sleep" signal is added to the FD circuit. Both of the DC level monitor and Adjustment unit are optional. When the "Sleep" signal is at "high" voltage level, V_adj will be approximately equal to 0V. As V_adj is connected to the adjustable inverter 33, as shown in FIGS. 20A and 20B for examples, the drain-to-source resistance of "FET2" 38 (or "FET3" 39) becomes very large such that the leak current tends to be "0".

Furthermore, by using logic circuit to control the value of CK such that CK=1 during Stand-by mode, output "out" can be kept stable while consuming very small power. In other words, the FD circuit of the present invention can be upgraded to a semi-static frequency divider. (Here, "static" frequency divider refers to those frequency dividers whose output value will not change even though the input clock signal does not change for a long period, especially during Stand-by mode.)

According to an embodiment of the present invention the features as below are obtained.

(1) Only one stage of buffer is used in the proposed frequency divider (New FD1 and New FD2).
(2) Using function selector (a combination of switches) to change signal path
(3) Shorter switching period, which implies higher operating frequency.
(4) Less number of elements used in the FD circuit.
(5) Smaller size. Besides having a higher operation frequency range, the circuit of the embodiment is of smaller size than conventional frequency divider.
(6) Using less number of logic gates, the circuit of the embodiment consumes less electric power.
(7) When a DC Level monitor and an adjustment unit are installed to the FD of the present invention, a wider operating frequency range can be achieved.
(8) The leak current can be kept small while a FET transistor and "Stand-by" mode control signal are added.
(9) Power saving "stand-by" mode is possible if a logic circuit is installed to monitor and to control the output value during the "stand-by" mode. In other words, the FD can be upgraded to a semi-static frequency divider. (as described in FIG. 19)

Some examples of application of the present invention are described below.

Figure 21:
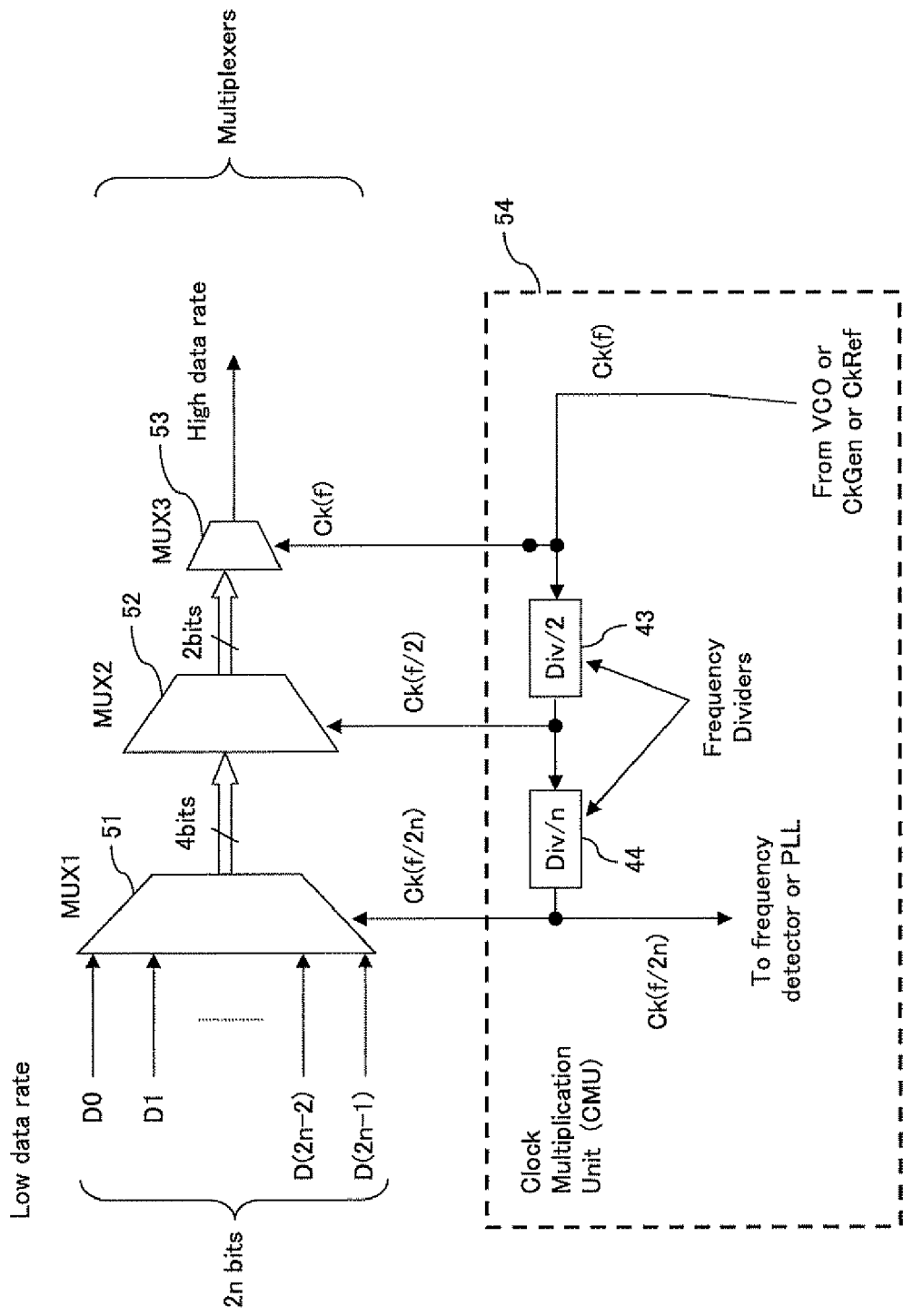
FIG. 21 shows a high speed multiplexing (MUX) system as an application of the present invention

FIG. 21 shows a high speed multiplexing (MUX) system, which contains three multiplexers (51, 52, 53), one divide-by-2 frequency divider "Div/2" 43 and one divide-by-n frequency divider "Div/n" 44, where n is an integer. There are 2n "low data rate" input signals to the multiplexer MUX1 to be multiplexed into a "high data rate" signal, through 3 consecutive multiplexers (MUX1(51), MUX2(52), MUX3(53)), where 2n is an even integer. The clock signals to MUX1, MUX2, and MUX3 are Ck(f/2n), Ck(f/2), and Ck(f), respectively, where Ck(f) is from a VCO or Clock Generator (Ck-Gen) or Reference Clock (CkRef) and is of the highest frequency f. The Ck(f/2) is the divided-by-2 clock signal, and of a frequency of f/2. The Ck(f/2n) is the divided-by-2n clock signal, and of a frequency of f/2n. The "Div/2" and "Div/n" frequency dividers are used to generate Ck(f/2) and Ck(f/2n), respectively. The frequency divider of the present invention is applicable to generate Ck(f/2) and also to generate Ck(f/2n) from Ck(f/2) by connecting the frequency dividers in series, because in most cases, n is a power of 2.

The Ck(f/2n) is also used as a signal for a frequency detector or PLL. The combination of "Div/2", "Div/n", VCO and PLL is called a Clock Multiplication Unit (CMU) in some articles. Since the Ck(f) signal is of the highest frequency, a high speed "Div/2" frequency divider is usually required. In cases where power consumption is a concern, "Div/2" and "Div/n" frequency dividers with low power consumption are required and the present invention satisfies this requirement.

Figure 22:
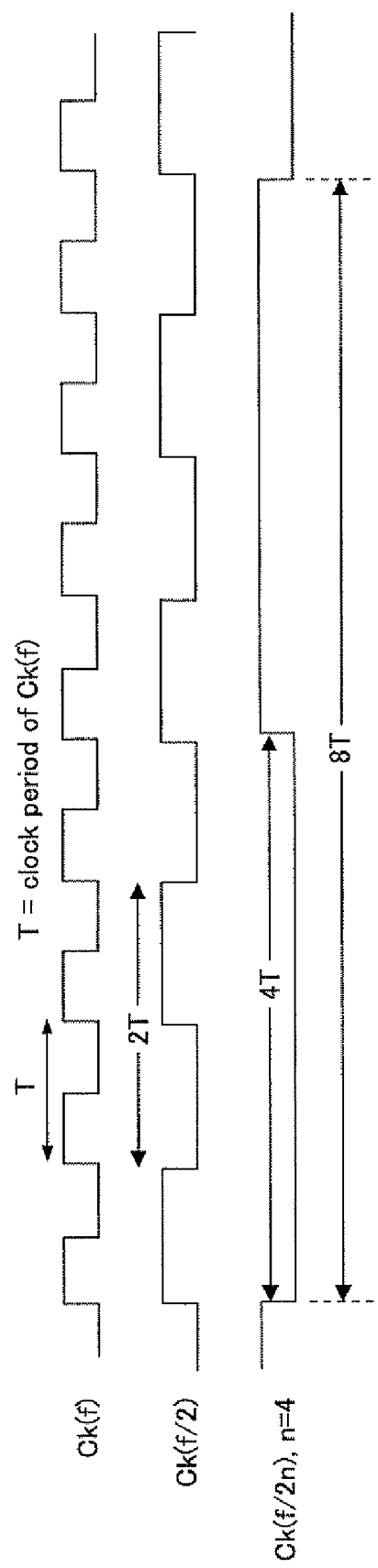
FIG. 22 shows the timing diagram for the MUX and PLL systems

FIG. 22 shows the timing diagram for the MUX and PLL systems in FIG. 21 when n=4. T is the clock period of Ck(f). As shown in the diagram, clock period of Ck(f/2) is equal to 2T and that of Ck(f/2n) is 8T, when n=4.

Figure 23:
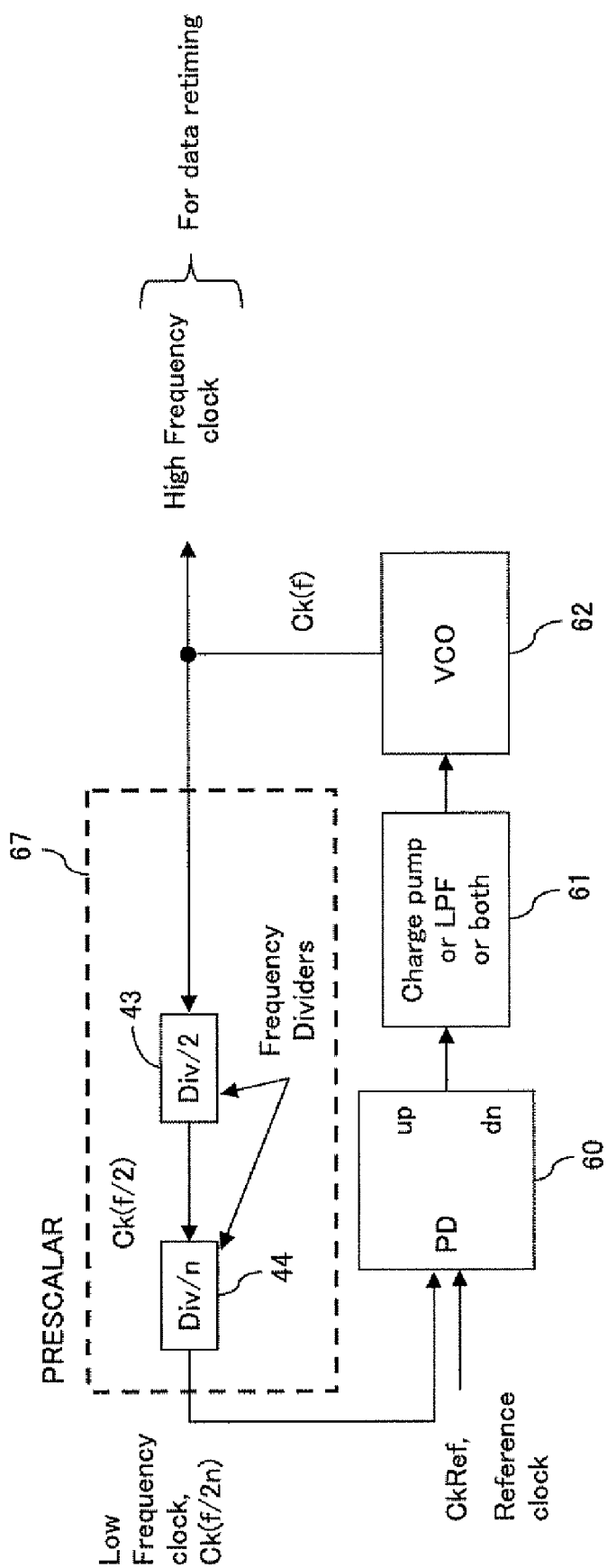
FIG. 23 shows a high speed phase locked loop (PLL) system as an application of the present invention

FIG. 23 shows a high speed phase locked loop (PLL) system, which contains two frequency dividers, a Phase Detector (PD) 60, the block 61 which is a Charge Pump(CP) or a Low Pass Filter (LPF) or both, and a VCO 62. In this PLL, "Div/2" and "Div/n" frequency dividers are used to generate Ck(f/2) and Ck(f/2n), respectively. Similar to the above example, since the Ck(f) signal is of the highest frequency, a high speed "Div/2" frequency divider is usually required. The combination of "Div/2" 43 and "Div/n" 44 frequency dividers is often called PRESCALAR in some articles. This circuit and its alternatives are widely used in both wire-line and wireless communication circuits.

In cases where power consumption is a concern, "Div/2" and "Div/n" frequency dividers with low power consumption are required and the present invention satisfies this requirement.

Again, FIG. 22 shows the timing diagram for the PLL systems in FIG. 23 when n=4. Explanation is similar to the case of FIG. 21 and therefore omitted.

FIG. 24 shows an example of application of the embodiment to a High Speed 2-Phase Clock Generator.

Figure 24A:
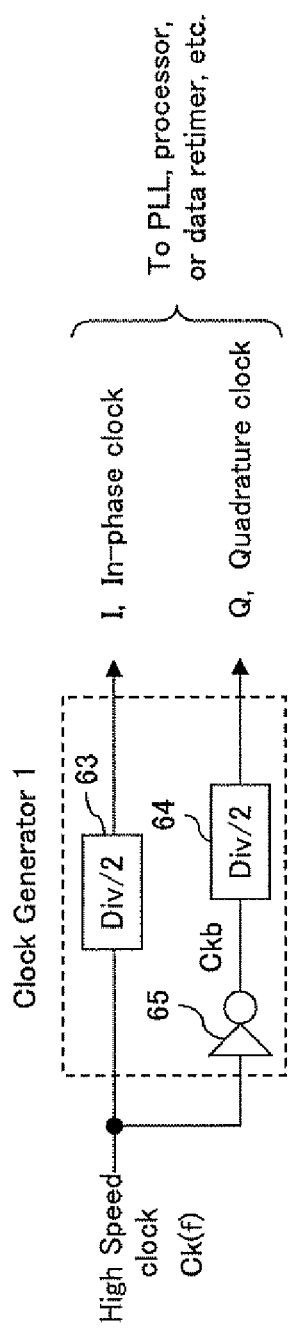
FIGS. 24A through 24C show an example of application of the embodiment to a High Speed 2-Phase Clock Generator
FIGS. 25A and 25B explain the application of the present invention to a multi-phase clock generator

In FIG. 24A, the clock generator contains one inverter 65 and two "Div/2" frequency dividers 63 and 64. I is the in-phase clock and Q is the quadrature clock, and both clock signals can be used by a PLL, processor, or data retimer (also called synchronizer or CDR in some articles), etc. In this example, the phase difference between I and Q is 90 degrees, while 360 degrees refer to one period or one cycle of either I or Q signal.

Figure 24B:
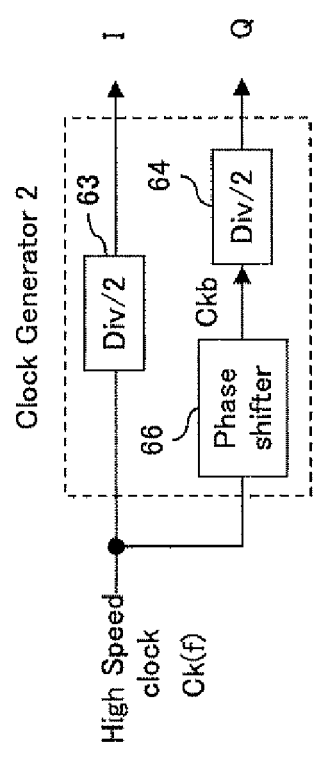
Figure 24C:
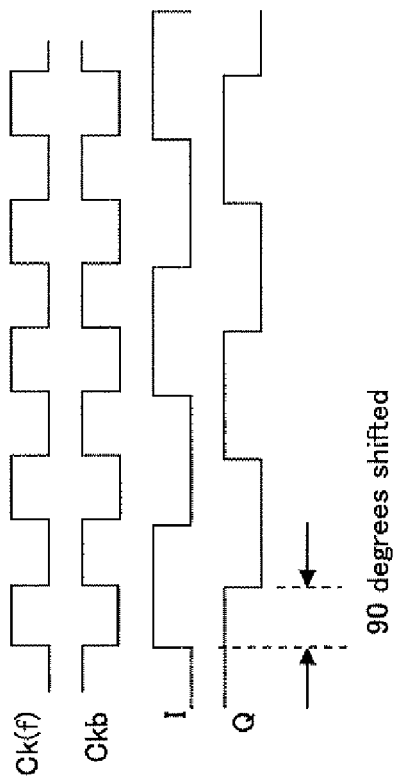

FIG. 24C shows the timing diagram of the High Speed Clock Generator in FIG. 24A. Ckb is an inverted clock of Ck(f). This means the phase difference between Ck(f) and Ckb is 180 degrees, while 360 degrees refer to one period of Ck(f). By dividing frequency of Ck(f) and Ckb by 2, I and Q clocks are generated respectively and the phase difference between I and Q clocks becomes 90 degrees, half of 180 degrees. This circuit and its alternatives are widely used in both wire-line and wireless communication circuits.

In the following context, a phase shift or phase difference of 360 degrees refers to the time interval of one cycle of the periodic signals to be compared.

FIG. 24B shows another implementation of a High Speed 2-Phase Clock Generator.

The basic structure is similar to that in the above example. However, instead of an inverter, a "phase shifter" 66 is used in this example. The "phase shifter" shifts Ck(f) by 180 degrees and produces the "Ckb" signal. This "phase shifter" can be a delay unit or a phase interpolator. Explanations of the two "Div/2" FDs and the signals {I, Q} are similar to those in FIG. 24A and therefore omitted.

Again, FIG. 24C shows the timing diagram of the High Speed Clock Generator in FIG. 24B. This circuit and its alternatives are widely used in both wire-line and wireless communication circuits. Explanation is similar to the cases of FIG. 24A and therefore omitted.

FIG. 25 explains the application of the present invention to a multi-phase clock generator.

Figure 25A:
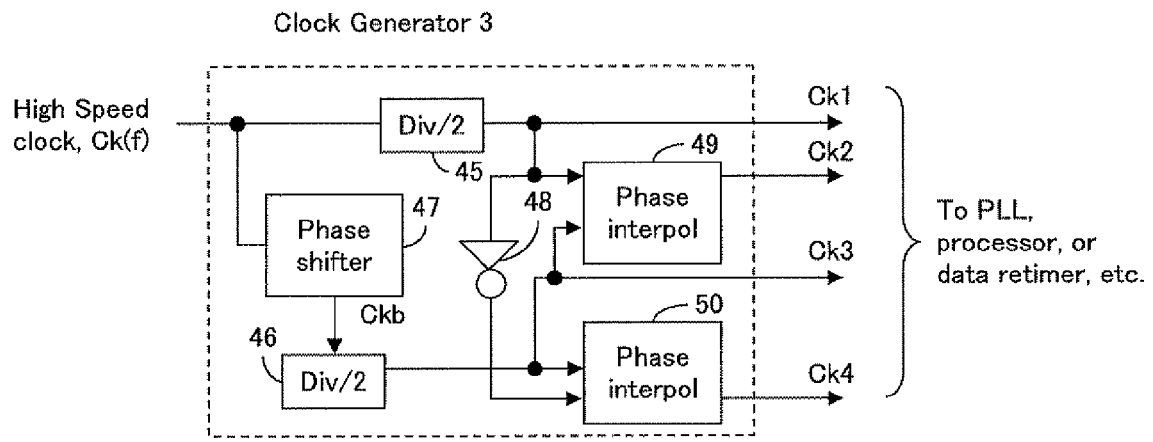
Figure 25B:
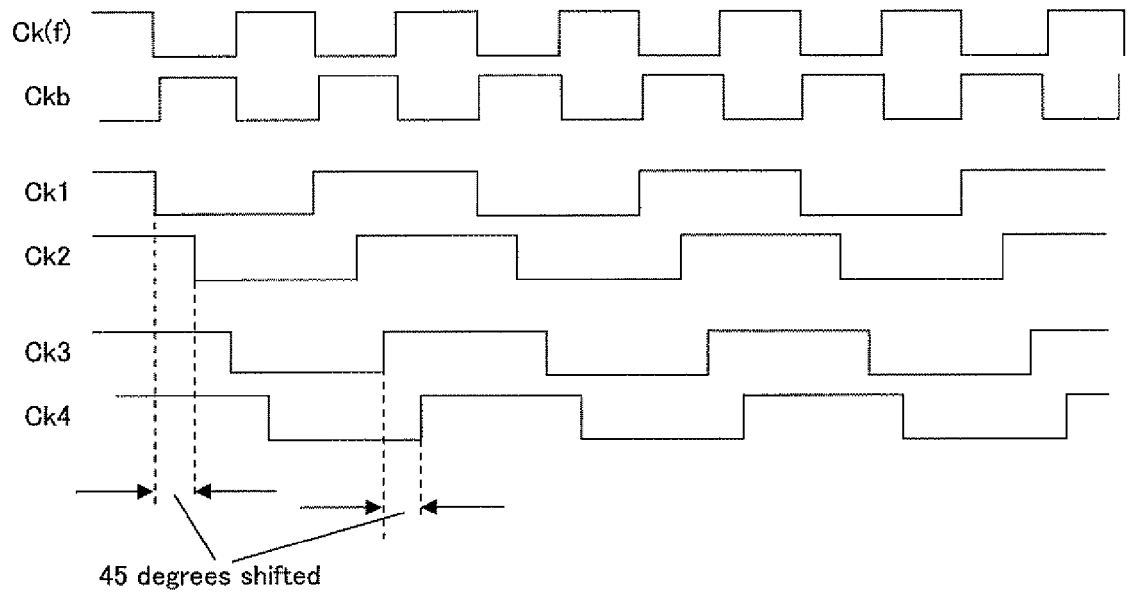

FIG. 25A shows a High speed Multi-Phase Clock Generator, in which one phase shifter and two "Div/2" frequency dividers, and two phase interpolators (phase interpol) are used to generate 4-phase clocks. FIG. 25B shows the timing diagram of Clock Generator 3, in which the phase shift among each of CK1-CK4 is 45 degrees.

In FIG. 25A, a high speed clock Ck(f) is input to "Div/2" 45 which divides Ck(f) by 2 to generate Ck1. The high speed clock Ck(f) is also input to the phase shifter 47, shifts the phase of Ck(f) by 180 degrees and outputs it as Ckb. Ckb is divided by 2 by "Div/2" 46 to generate Ck3. Ck3's phase is shifted by 90 degrees relative to Ck1. The phase interpolator 49 receives Ck1 and Ck3 generating Ck2 phase of which is shifted relative to Ck1 by a half of the phase difference between Ck1 and Ck3, 45 degrees. The phase interpolator 50 receives inverted Ck1 and Ck3 generating Ck4 phase of which is shifted relative to Ck3 by a half of the phase difference between inverted Ck1 and Ck3, 45 degrees. This means Ck4 has a phase of 135 degrees relative to non-inverted Ck1.

With combination of PLL or phase interpolator, the proposed FDs are applicable to generate accurate clock signals in all of 2-Phase Clock Generator and Multi-Phase Clock Generators.

FIG. 26 shows another application of the present invention to a multi-phase clock generator.

FIG. 26A shows another High speed Multi-Phase Clock Generator, in which one phase shifter and two "Div/2" frequency dividers, and two inverters are used to generate 4-phase clocks. In FIG. 26A, the phase shifter 59 shifts phase of Ck(f) by 180 degrees to generate Ckb. Ck(f) is divided by 2 by "Div/2" 55 to generate Ck1. Ck1 is input to the inverter 57 to generate Ck3 phase of which is shifted by 180 degrees relative to Ck1. Ckb is divided by 2 by "Div/2" 56 to generate Ck2 phase of which is shifted by 90 degrees relative to Ck1. Ck2 is input to the inverter 58 to generate Ck4 phase of which is shifted by 270 degrees relative to Ck1.

FIG. 26B shows the timing diagram of Clock Generator 4, while the phase shift among each of CK1-CK4 is 90 degrees. With combination of PLL or phase interpolator, the FDs of the present invention are applicable to generate accurate clock signals in all of 2-Phase Clock Generators and Multi-Phase Clock Generators.

FIG. 27 explains a "Divide-by-2" frequency divider as an application of the present invention.

Figure 27A:
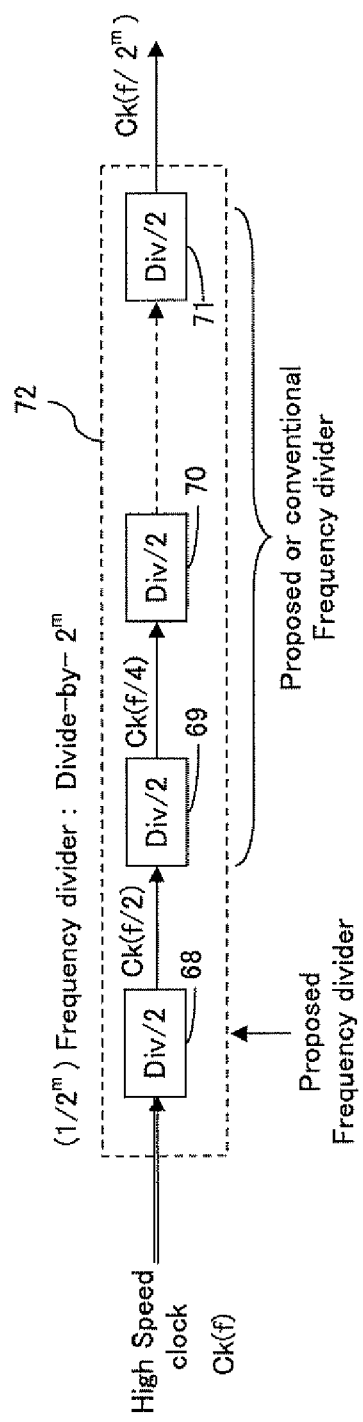

FIG. 27 shows the configuration of a "Divide-by-$2^m$" frequency divider. In commonly used (1/n) divider, n is equal to $2^m$, where m is an integer. In other words, the "Div/n" blocks in FIGS. 21 and 23 are also called "divide-by-$2^m$" or "$1/2^m$" frequency dividers. A "$1/2^m$" frequency divider can be constructed by cascading several "divide-by-2" (Div/2) frequency dividers, as shown in FIG. 27A. Since input to the "$1/2^m$" frequency divider is usually of the highest frequency, the first "Div/2" block 68 should be the frequency divider of the present invention. After first frequency division, the clock frequency of Ck(f/2) is a half. After second frequency division by "Div/2" block 69, the clock frequency of Ck(f/4) is a quarter, and so on. In some applications, conventional master-slave frequency dividers can handle the divided clock signals. Circuit designers can choose among those conventional and proposed frequency dividers, depending on speed and power consumption requirements. In other words, "Div/2" blocks 69, 70, 71 may be proposed or conventional frequency dividers.

Figure 27B:
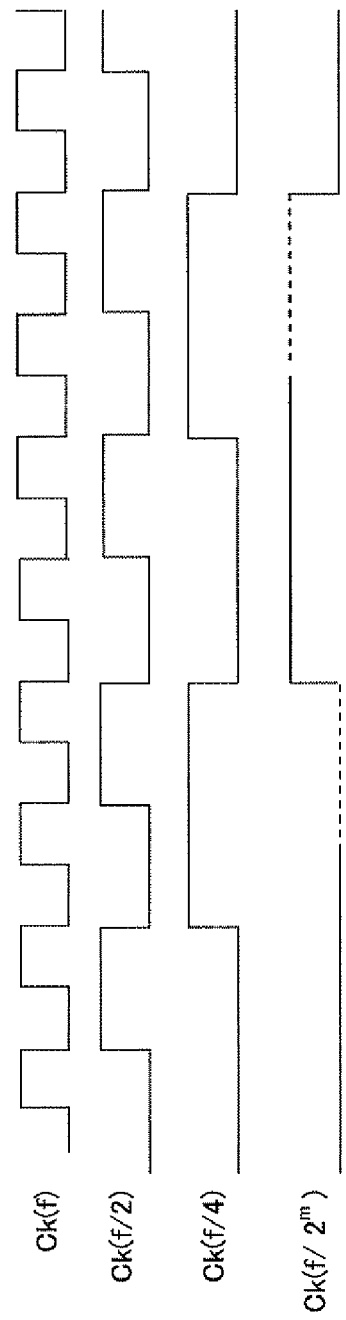

A typical timing diagram of "Divide-by-$2^m$" frequency divider is shown in FIG. 27B. As is clearly shown in FIG. 27B, Ck(f/2) has a frequency of ½ of Ck(f), Ck(f/4) has a frequency of ½ of Ck(f/2) which means ¼ of Ck(f) and Ck(f/$2^m$) has a frequency of $1/2^m$ of Ck(f).

The proposed frequency divider of the present invention is applicable to Clock Data Recovery (CDR) systems, high speed transceivers, wire-line and wireless communication systems. The frequency divider can be built on any form of Large Scale Integrated (LSI) circuit or Printed Circuit Board (PCB) or a combination of both. It is applicable to MUX systems, PLL systems. It can also be used to build a Multi-Phase Clock Generator, as described in examples of a High Speed Clock Generator in FIGS. 24 through 26, and a "Divide-by-$2^m$" frequency divider shown in FIG. 27.

What is claimed is:
1. A frequency divider comprising:
   a function selector unit selecting a signal so that the selected signal in one of two feedback paths is domi- nantly input to a buffer unit, in synchronism with a clock signal frequency of which satisfies a certain condition;

the buffer unit buffering the signal input from the function selector unit and outputting the buffered signal;

the two feedback paths feeding back the output signal of the buffer unit to an input of the buffer unit; and an inverter unit provided in one of the two feedback paths and inverting a signal value.

2. The frequency divider according to claim 1, wherein the function selector comprises:

a first switch unit provided in one of the two feedback paths and turning on and off in synchronous with the clock signal in order to open and close one of the two feedback paths; and a second switch unit provided in the other of the two feedback paths and turning on and off in an opposite timing to the first switch unit in order to open and close the other of the two feedback paths.

3. The frequency divider according to claim 1, wherein function selector comprises:

a switch unit turning on and off in synchronous with the clock signal, wherein one of the two feedback paths is opened and closed by the switch unit while another of the two feedback paths including the inverter unit is always closed.

4. The frequency divider according to claim 2, wherein the first switch unit and the second switch unit transistor.

5. The frequency divider according to claim 1, wherein an operational delay of the inverter unit is adjustable.

6. The frequency divider according to claim 5, wherein the inverter unit comprises a variable resistor and the operational delay of the inverter unit is adjusted by changing the resistance of the variable resistor.

7. The frequency divider according to claim 1, further comprising:

a control unit turning off the inverter unit when the frequency divider is in a stand by mode.

8. The frequency divider according to claim 1, wherein the certain condition is expressed by $$1/\{2*(t\_inv+t\_sw+t\_buf)\} < \text{the frequency of the clock signal} < \min\{1/\{2*(t\_sw+t\_buf)\}, 1/(t\_inv+t\_sw+t\_buf)\},$$

where t_inv is a delay time of the inverter unit, t_sw is a delay time of the function selector unit, t_buf is a delay time of the buffer unit and min{A, B} means smaller one of A and B.

9. A multiplexing system using the frequency divider according to claim 1.

10. A phase locked loop system using the frequency divider according to claim 1.

11. A clock generator using the frequency divider according to claim 1.

12. The frequency divider according to claim 3, wherein the switch unit is a transistor.

* * * * *

UNITED STATES PATENT AND TRADEMARK OFFICE
CERTIFICATE OF CORRECTION

| | |
|---|---|
| PATENT NO. | : 7,595,668 B2 |
| APPLICATION NO. | : 11/680841 |
| DATED | : September 29, 2009 |
| INVENTOR(S) | : Tszshing Cheung |

It is certified that error appears in the above-identified patent and that said Letters Patent is hereby corrected as shown below:

Column 13, Line 27, change "transistor." to --are transistors.--.

Column 14, Line 8, change "stand by" to --stand-by--.

Signed and Sealed this

Twenty-sixth Day of January, 2010

David J. Kappos
*Director of the United States Patent and Trademark Office*